US012694945B2

(12) United States Patent
Jang et al.

(10) Patent No.: US 12,694,945 B2
(45) Date of Patent: Jul. 28, 2026

(54) MEMORY DEVICE INCLUDING REPAIR CIRCUIT AND OPERATING METHOD THEREOF

(71) Applicant: Samsung Electronics Co., Ltd., Suwon-si (KR)

(72) Inventors: Wonyoung Jang, Suwon-si (KR); Taewon Kim, Suwon-si (KR); Sanghee Kang, Suwon-si (KR); Taeyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 65 days.

(21) Appl. No.: 18/665,817

(22) Filed: May 16, 2024

(65) Prior Publication Data

US 2025/0069682 A1    Feb. 27, 2025

(30) Foreign Application Priority Data

Aug. 24, 2023    (KR) ........................ 10-2023-0111516

(51) Int. Cl.
*G11C 29/56* (2006.01)
*G11C 29/00* (2006.01)

(52) U.S. Cl.
CPC ........ *G11C 29/76* (2013.01); *G11C 29/56008* (2013.01); *G11C 29/56016* (2013.01)

(58) Field of Classification Search
CPC .............. G11C 29/76; G11C 29/56008; G11C 29/56016; G11C 29/44; G11C 11/4078; G11C 11/4087; G11C 29/808
See application file for complete search history.

(56) References Cited

U.S. PATENT DOCUMENTS

| | | | | |
|---|---|---|---|---|
| 6,452,859 B1* | 9/2002 | Shimano | ............... | G11C 11/409 |
| | | | | 365/230.06 |
| 6,920,073 B2 | 7/2005 | Lee | | |
| 7,336,549 B2 | 2/2008 | Min et al. | | |
| 7,768,831 B2 | 8/2010 | Byeon et al. | | |
| 9,293,227 B1 | 3/2016 | Takasugi | | |
| 9,324,398 B2 | 4/2016 | Jones et al. | | |
| 9,455,051 B1 | 9/2016 | Lim | | |
| 2010/0110808 A1* | 5/2010 | Riho | ........................ | G11C 8/08 |
| | | | | 365/230.06 |

(Continued)

FOREIGN PATENT DOCUMENTS

| | | |
|---|---|---|
| CN | 105895164 A | 8/2016 |
| KR | 100499640 B1 | 7/2005 |
| KR | 100689706 B1 | 3/2007 |

(Continued)

*Primary Examiner* — Mohammed A Bashar
(74) *Attorney, Agent, or Firm* — Wolf, Greenfield & Sacks, P.C.

(57) ABSTRACT

A memory device including a repair circuit and an operating method of the memory device are provided. The operating method includes outputting a signal representing a pre-decoded faulty row address based on predecoding a faulty row address, outputting a signal representing a pre-decoded row address based on predecoding a row address, outputting hit signals based on comparing a bit value of the pre-decoded faulty row address with a bit value of the pre-decoded row address, outputting a repair enable signal based on the hit signals, and performing a row repair operation based on the repair enable signal.

20 Claims, 15 Drawing Sheets

(56)  References Cited

U.S. PATENT DOCUMENTS

2022/0199141 A1     6/2022   Arai
2023/0207033 A1*    6/2023   Gadamsetty ............. G11C 8/06
                                            365/185.09

FOREIGN PATENT DOCUMENTS

KR          100918299  B1     9/2009
KR          20170048892  A     5/2017

* cited by examiner

FIG. 7B

| Two RA bits (2bit) | | PRA <3:0> (4bit) | | | |
|---|---|---|---|---|---|
| RA <2> | RA <3> | PRA 2/3 0 | PRA 2/3 1 | PRA 2/3 2 | PRA 2/3 3 |
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

FIG. 7D

| Two FRA bits (2bit) | | PFRA <3:0> (4bit) | | | |
|---|---|---|---|---|---|
| FRA <2> | FRA <3> | PFRA 2/3 0 | PFRA 2/3 1 | PFRA 2/3 2 | PFRA 2/3 3 |
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

FIG. 8B

| Two RA bits (2bit) | | PRA 2/3 <3:0> (4bit) | | | | PFRA 2/3 <3:0> (4bit) | | | | HIT 2/3 | CASE |
|---|---|---|---|---|---|---|---|---|---|---|---|
| RA <2> | RA <3> | PRA 2/3 0 | PRA 2/3 1 | PRA 2/3 2 | PRA 2/3 3 | PFRA 2/3 0 | PFRA 2/3 1 | PFRA 2/3 2 | PFRA 2/3 3 | HIT 2/3 | CASE |
| 0 | 0 | 1 | 0 | 0 | 0 | 1 | 0 | 0 | 0 | 1 | MATCH |
|   |   | 1 | 0 | 0 | 0 | 0 | * | * | * | 0 | MISMATCH |
| 1 | 0 | 0 | 1 | 0 | 0 | 0 | 1 | 0 | 0 | 1 | MATCH |
|   |   | 0 | 1 | 0 | 0 | * | 0 | * | * | 0 | MISMATCH |
| 0 | 1 | 0 | 0 | 1 | 0 | 0 | 0 | 1 | 0 | 1 | MATCH |
|   |   | 0 | 0 | 1 | 0 | * | * | 0 | * | 0 | MISMATCH |
| 1 | 1 | 0 | 0 | 0 | 1 | 0 | 0 | 0 | 1 | 1 | MATCH |
|   |   | 0 | 0 | 0 | 1 | * | * | * | 0 | 0 | MISMATCH |

Mark "*" means "1" or "0"

MEMORY DEVICE INCLUDING REPAIR CIRCUIT AND OPERATING METHOD THEREOF

CROSS-REFERENCE TO RELATED APPLICATION

This application is based on and claims priority under 35 U.S.C. § 119 to Korean Patent Application No. 10-2023-0111516, filed on Aug. 24, 2023, in the Korean Intellectual Property Office, the disclosure of which is incorporated by reference herein in its entirety.

BACKGROUND

The inventive concepts relate to a memory device, and more particularly, to a memory device including a repair circuit using pre-decoding and an operating method of the memory device.

Semiconductor chips are manufactured through semiconductor manufacturing processes and then tested by test equipment in a wafer, die, or package state. Through testing, faulty parts or chips are selected. When some memory cells are faulty, a repair operation is carried out to salvage semiconductor chips. As micro-processing of semiconductor chips, such as dynamic random access memory (DRAM) chips, continues, the likelihood of errors occurring in manufacturing processes is increasing. Errors may occur during chip operation even if the errors are not detected in an initial testing phase.

Demand for high-capacity DRAM is increasing for reliable and fast real-time processing of a large amount of data. The performance of DRAM may vary with time. Memory systems may anticipate reliability, availability, and serviceability (RAS) features with respect to DRAM. Accordingly, some DRAM detects faulty memory cells in a memory cell array (MCA) during a test operation on the MCA, performs a repair operation to replace the faulty memory cells with redundancy memory cells, and may include a repair circuit performing the repair operation.

A repair circuit may store a faulty address of a faulty memory cell detected during a test operation and generate repair control signals for instructing to perform a repair operation on the faulty address. Based on the repair control signals, DRAM may perform a repair operation to replace a faulty word line selected by the faulty address with a redundancy word line or replace a faulty bit line selected by the faulty address with a redundancy bit line.

SUMMARY

The inventive concepts provide a memory device including a repair circuit, which has low power consumption by using pre-decoding, and an operating method of the memory device.

According to aspects of the inventive concepts, there is provided an operating method of a memory device. The operating method includes outputting a signal representing a pre-decoded faulty row address based on predecoding a faulty row address, outputting a signal representing a pre-decoded row address based on predecoding a row address, outputting hit signals based on comparing a bit value of the pre-decoded faulty row address with a bit value of the pre-decoded row address, outputting a repair enable signal based on the hit signals, and performing a row repair operation based on the repair enable signal.

According to aspects of the inventive concepts, there is provided a memory device including a memory cell array including a redundancy memory cell, and a repair circuit configured to perform a row repair operation by replacing a faulty row address with a redundancy row address, based on a repair enable signal, wherein the repair circuit includes a first register configured to store the faulty row address, a second register configured to store a row address, and a repair control circuit, and wherein the repair control circuit includes a pre-decoder circuit configured to predecode the faulty row address and output a signal that represents a pre-decoded faulty row address, and predecode the row address and output a signal that represents a pre-decoded row address, a comparison circuit configured to compare a bit value of the pre-decoded faulty row address with a bit value of the pre-decoded row address and output hit signals based on a result of the comparison, and a combinational logic circuit configured to output the repair enable signal based on the hit signals.

According to aspects of the inventive concepts, there is provided a memory system including a host device configured to transmit a command for a repair operation, and a memory device configured to perform the repair operation in response to the command, wherein the memory device includes a repair control circuit configured to predecode a faulty row address and output a signal that represents a pre-decoded faulty row address, predecode a row address and output a signal that represents a pre-decoded row address, compare a bit value of the pre-decoded faulty row address with a bit value of the pre-decoded row address and output hit signals based on a result of the comparison, and output a repair enable signal based on the hit signals.

BRIEF DESCRIPTION OF THE DRAWINGS

Embodiments will be more clearly understood from the following detailed description taken in conjunction with the accompanying drawings, in which:

FIG. 7B is a diagram illustrating the operation of a first row pre-decoder circuit according to some embodiments;

FIG. 7D is a diagram illustrating the operation of a first fuse pre-decoder circuit according to some embodiments;

FIG. 8B is a diagram illustrating the operation of a first sub comparison circuit according to some embodiments;

DETAILED DESCRIPTION

Hereinafter, example embodiments are described in detail with reference to the accompanying drawings.

Figure 1:
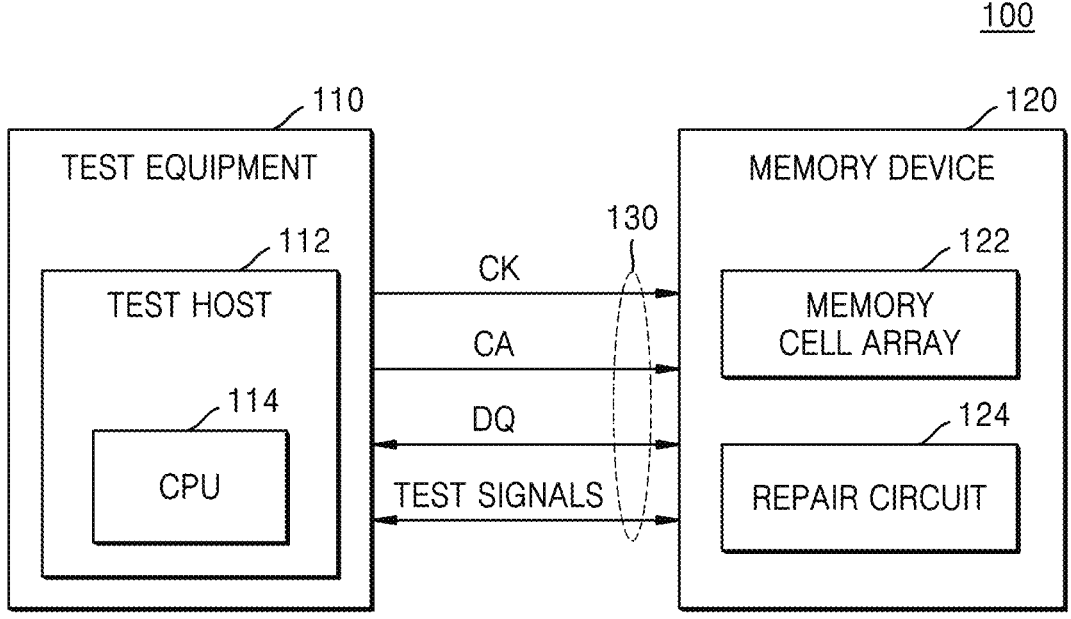
FIG. 1 is a block diagram of a test system, which tests a memory device, according to some embodiments.

FIG. 1 is a block diagram of a test system, which tests a memory device, according to some embodiments.

A test method, by which test equipment 110 tests a memory device 120 in a test system 100 (also referred to as a memory system), is described with reference to FIG. 1. The test equipment 110 may include a test host 112, which tests the memory device 120 corresponding to a device under test (DUT). The test host 112 may include a central processing unit (CPU) 114, which controls hardware, software, and/or firmware to perform a test operation on the memory device 120. The test host 112 may transmit test signals from the CPU 114 to the memory device 120 or transmit, to the CPU 114, test result values output from the memory device 120 with respect to the test signals. Here, the test host 112 may be referred to as a host device.

The test host 112 may be implemented by a test program. The test program may include a test algorithm or pattern for performing a test operation. For example, the test host 112 may store particular data in a storage area of the DUT, i.e., a memory cell array 122, then read the particular data, and then determine a pass or a fail of a test operation according to whether the read data is the same as the particular data. The test host 112 may measure changes in voltage, current, and/or frequency of the memory device 120 under various driving conditions and test whether the changes are within a tolerance range.

The memory device 120 may include dynamic random access memory (DRAM) but is not limited thereto. For example, the memory device 120 may correspond to double data rate synchronous DRAM (DDR SDRAM), low power DDR (LPDDR) SDRAM, graphics DDR (GDDR) SDRAM, or Rambus DRAM (RDRAM). For example, the memory device 120 may include static RAM (SRAM), high-bandwidth memory (HBM), or processor-in-memory (PIM).

According to some embodiments, the memory device 120 may include a non-volatile memory device. For example, the memory device 120 may include flash memory or resistive-type memory, such as phase-change RAM (PRAM), magnetic ram (MRAM), or resistive RAM (RRAM).

The test host 112 may test the memory device 120 through a channel 130. The channel 130 may include buses and/or signal lines, which physically and/or electrically connect the test host 112 to the memory device 120. For example, a clock signal CK may be received by the memory device 120 through a clock bus, a command and address CA may be received by the memory device 120 through a command/address bus, and data DQ may be exchanged between the test host 112 and the memory device 120 through a data bus. Test signals may be exchanged between the test host 112 and the memory device 120 through test signal lines. For conciseness of the drawings, it is illustrated that a signal is transmitted through a single signal line between the test host 112 and the memory device 120. However, each bus may actually include one or more signal lines to transmit signals therethrough.

The test host 112 may provide a command to the memory device 120 to test a memory operation. Non-limiting examples of commands for memory may include timing commands for controlling the timings of various operations, access commands for accessing the memory, such as a read command for performing a read operation and a write command for performing a write operation, a mode register write and read command for performing a write and read operation on a mode register, and a repair command.

When the test host 112 provides a write command and a related address to the memory device 120 during a test, the memory device 120 may receive the write command and the related address and perform a write operation by writing write data from the test host 112 to a memory location corresponding to the related address. The write data may be provided from the test host 112 to the memory device 120 according to the timing related to the reception of the write command. For example, when the write data is provided from the test host 112 to the memory device 120, the timing may be based on a write latency (WL) value that indicates the number of clock cycles after the write command. The test host 112 may program the WL value to a mode register set (MRS) of the memory device 120. As is known, the MRS of the memory device 120 may be programmed with information for setting various operation modes and/or for selecting characteristics for memory operation. Information for a test operation of the memory device 120 may be stored in a test MRS (TMRS).

When a read command and a related address are provided from the test host 112 to the memory device 120 during a test, the memory device 120 may receive the read command and the related address and perform a read operation by outputting read data from a memory location corresponding to the related address. The read data may be provided from the memory device 120 to the test host 112 according to the timing related to the reception of the read command. For example, when the read data is provided from the memory device 120 to the test host 112, the timing may be based on a read latency (RL) value that indicates the number of clock cycles after the read command. The test host 112 may set the RL value in the memory device 120. For example, the RL value may be programmed to the MRS of the memory device 120.

The test host 112 may provide a repair command and a faulty address to the memory device 120. The repair command may include a post package repair (PPR) command. The PPR command may instruct to store the faulty address, which is detected after the memory device 120 is packaged, in non-volatile memory (e.g., a fuse array) of the memory device 120 and perform a repair operation on the faulty address. In response to the PPR command, the memory device 120 may perform a PPR operation by replacing a faulty word line selected by the faulty address with a redundancy word line or replacing a faulty bit line selected by the faulty address with a redundancy bit line.

The memory device 120 may include the memory cell array 122 and a repair circuit 124. The memory cell array 122 may include a plurality of rows, a plurality of columns, and a plurality of memory cells respectively at the intersections of the rows and the columns. A memory cell of the memory cell array 122 may correspond to a volatile memory cell, e.g., a DRAM cell. The memory cell array 122 may include redundancy rows and/or redundancy columns, which are connected to redundancy memory cells for repairing a faulty memory cell having a defect or a fault therein. As used herein, "an element A connected to an element B"

(or similar language) means that the element A is physically and/or electrically connected to the element B.

The repair circuit 124 may be configured to repair faulty memory cells detected in the memory cell array 122 by using redundancy memory cells. The repair circuit 124 may repair faulty cells, which are detected through an electrical die sorting (EDS) test after semiconductor manufacturing processes for the memory device 120. The repair circuit 124 may also perform a PPR operation by repairing defective memory cells, which occur during a package/module/mount test of the memory device 120, with redundancy memory cells.

Figure 2A:
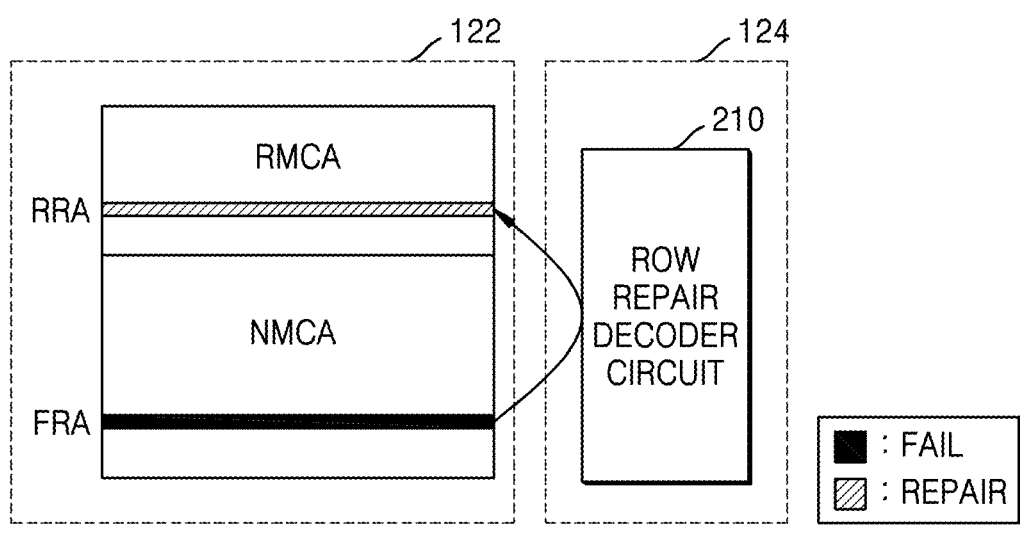
FIGS. 2A and 2B are diagrams illustrating a repair operation performed by a repair circuit in FIG. 1.
Figure 2B:
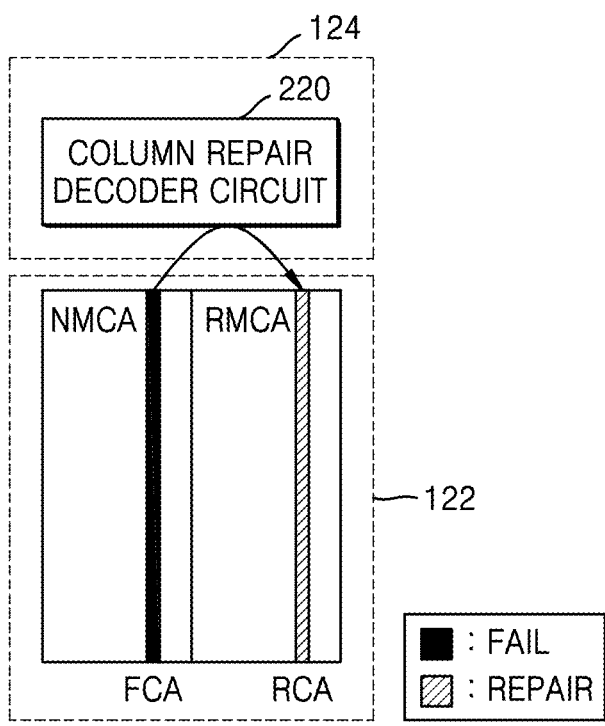

FIGS. 2A and 2B are diagrams illustrating a repair operation performed by the repair circuit 124 in FIG. 1.

The repair circuit 124 may perform a repair operation by respectively replacing a faulty row address FRA and/or a faulty column address FCA with a redundancy row address RRA and/or a redundancy column address RCA.

Referring to FIG. 2A, the repair circuit 124 may repair the faulty row address FRA related to a faulty memory cell with the redundancy row address RRA. The memory cell array 122 may include a normal memory cell array NMCA and a redundancy memory cell array RMCA. The normal memory cell array NMCA may include memory cells connected to word lines and bit lines. The redundancy memory cell array RMCA may include memory cells connected to redundancy word lines and/or redundancy bit lines. The repair circuit 124 may include a row repair decoder circuit 210, which determines the redundancy row address RRA such that redundancy resources for repairing the faulty row address FRA do not overlap each other. According to some embodiments, the row repair decoder circuit 210 may sequentially or randomly set the redundancy row address RRA in the redundancy memory cell array RMCA to repair the faulty row address FRA.

The row repair decoder circuit 210 may perform a row repair operation such that the redundancy row address RRA instead of the faulty row address FRA is selected. When an access row address applied to the memory device 120 designates the faulty row address FRA in the normal memory cell array NMCA, redundancy memory cells corresponding to the redundancy row address RRA in the redundancy memory cell array RMCA may be selected. The row repair decoder circuit 210 may deactivate a word line corresponding to the faulty row address FRA and activate a redundancy word line corresponding to the redundancy row address RRA. Accordingly, instead of memory cells corresponding to the faulty row address FRA, the redundancy memory cells corresponding to the redundancy row address RRA may be selected.

Referring to FIG. 2B, the repair circuit 124 may perform a column repair operation such that the redundancy column address RCA instead of the faulty column address FCA is selected. The repair circuit 124 may include a column repair decoder circuit 220, which determines the redundancy column address RCA such that redundancy resources for repairing the faulty column address FCA do not overlap each other. According to some embodiments, the column repair decoder circuit 220 may sequentially or randomly set the redundancy column address RCA in the redundancy memory cell array RMCA to repair the faulty column address FCA.

The column repair decoder circuit 220 may perform a column repair operation such that the redundancy column address RCA instead of the faulty column address FCA is selected. When an access column address applied to the memory device 120 designates the faulty column address FCA in the normal memory cell array NMCA, redundancy memory cells corresponding to the redundancy column address RCA in the redundancy memory cell array RMCA may be selected. The column repair decoder circuit 220 may not select a bit line corresponding to the faulty column address FCA but instead select a redundancy bit line corresponding to the redundancy column address RCA. Accordingly, instead of memory cells corresponding to the faulty column address FCA, the redundancy memory cells corresponding to the redundancy column address RCA may be selected.

The repair circuit 124 may perform a repair operation and store redundancy mapping information indicating that a faulty address (e.g., the faulty row address FRA and/or the faulty column address FCA) is replaced with a redundancy address (e.g., the redundancy row address RRA and/or the redundancy column address RCA). The repair circuit 124 may store the faulty address by using a fuse array (e.g., 400 in FIG. 4) including an anti-fuse, which changes from a high resistance state into a low resistance state according to an electrical signal (e.g., a high-voltage signal). The repair circuit 124 may compare an access address applied to the memory device 120 with a faulty address stored in the fuse array and may control redundancy memory cells corresponding to a redundancy address to be selected instead of memory cells corresponding to the faulty address when the access address is determined to be the same as the faulty address as a result of the comparison.

Figure 3:
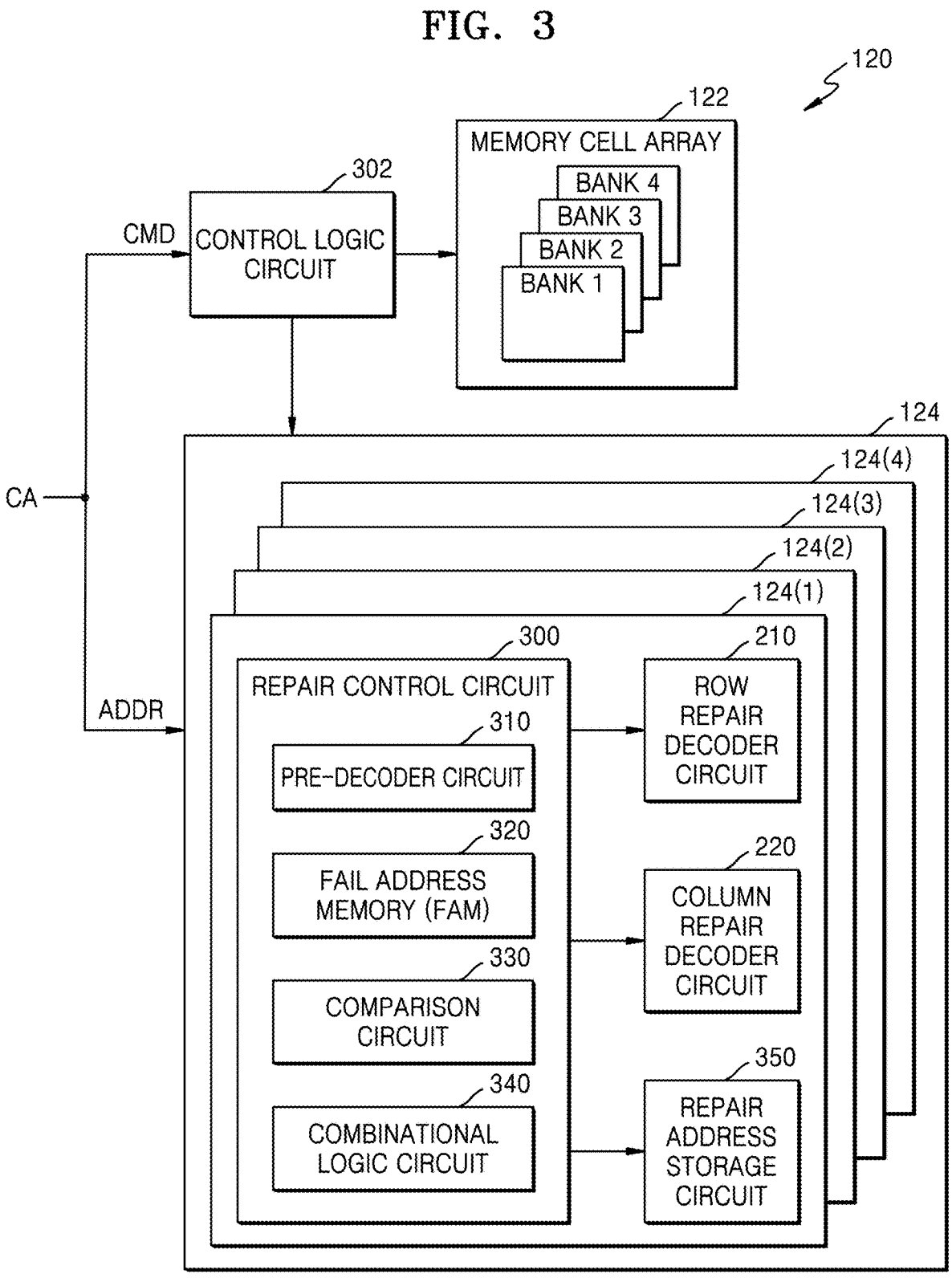
FIG. 3 is a block diagram illustrating a memory device including a repair circuit, according to some embodiments.
Figure 4:
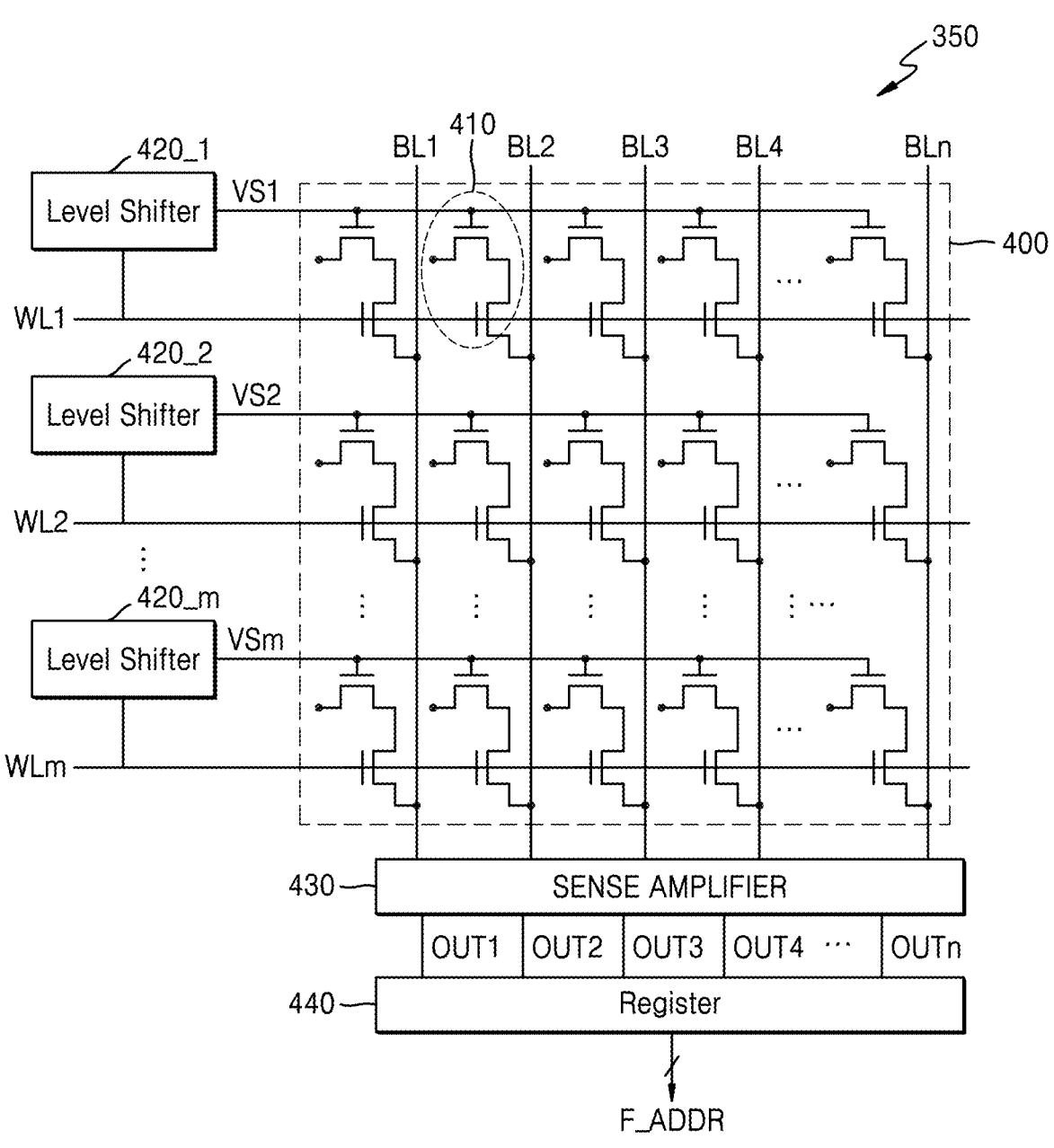
FIG. 4 is a diagram illustrating a repair address storage circuit in FIG. 3.

FIG. 3 is a block diagram illustrating the memory device 120 including the repair circuit 124, according to some embodiments. FIG. 4 is a diagram illustrating a repair address storage circuit in FIG. 3.

Referring to FIG. 3 in conjunction with FIGS. 1 to 2B, the memory device 120 may include the memory cell array 122, a control logic circuit 302, and the repair circuit 124. Although not shown in FIG. 3, the memory device 120 may further include a row decoder, a word line driver, a column decoder, a read/write circuit, a clock circuit, an address buffer, an MRS, and an input/output (I/O) circuit. The configuration of the memory device 120 of FIG. 3 does not indicate or imply a limitation to the inventive concepts.

The memory cell array 122 may include first to fourth banks BANK1 to BANK4. A row decoder and a column decoder may be provided in correspondence to each of the first to fourth banks BANK1 to BANK4. A row decoder and a column decoder, which are connected to a bank corresponding to a bank address, may be activated. Each of the first to fourth banks BANK1 to BANK4 may include a plurality of memory cells, which are provided in a matrix of rows and columns, and redundancy memory cells connected to redundancy rows and/or redundancy columns.

The control logic circuit 302 may receive a command CMD through the command/address bus of the channel 130 and generate control signals corresponding to the command CMD. The control logic circuit 302 may control operation timing of the memory device 120 when a memory operation is performed.

The repair circuit 124 may receive an address ADDR through a command/address bus of the channel 130 and perform an operation corresponding to the control signals of the control logic circuit 302.

The repair circuit 124 may include first to fourth repair circuits 124(1) to 124(4) respectively corresponding to the first to fourth banks BANK1 to BANK4. Each of the first to fourth repair circuits 124(1) to 124(4) may include the row repair decoder circuit 210, the column repair decoder circuit 220, a repair control circuit 300, and a repair address storage circuit 350. Each of the row repair decoder circuit 210 (e.g., see FIG. 2A) and the column repair decoder circuit 220 (e.g., see FIG. 2B) may perform a repair operation such that a redundancy address (e.g., the redundancy row address RRA or the redundancy column address RCA) instead of a faulty address (e.g., the faulty row address FRA or the faulty column address FCA) is selected based on repair control signals generated by the repair control circuit 300. Each of the first to fourth repair circuits 124(1) to 124(4) may replace the faulty row address FRA and/or the faulty column address FCA of a current bank with the redundancy row address RRA and/or the redundancy column address RCA by using the row repair decoder circuit 210 and/or the column repair decoder circuit 220.

The repair control circuit 300 may include a pre-decoder circuit 310, a fail address memory (FAM) 320, a comparison circuit 330, and a combinational logic circuit 340. The repair control circuit 300 may receive a faulty address from the test host 112 and store the faulty address in a register (e.g., 510 in FIG. 5) of the FAM 320. The faulty address stored in the FAM 320 may correspond to the faulty row address FRA and/or the faulty column address FCA described above with reference to FIGS. 2A and 2B. The repair control circuit 300 may store the faulty address, which is stored in the FAM 320, in a fuse array (e.g., 400 in FIG. 4) of the repair address storage circuit 350.

Referring to FIG. 4, the repair address storage circuit 350 may include a fuse array 400 including a plurality of anti-fuses 410, level shifters 420_1 to 420_m each generating high voltage for changing the resistance state of the anti-fuses 410, and a sense amplifier 430 sensing and amplifying information stored in the fuse array 400. The repair address storage circuit 350 may further include a register 440 storing fuse data, which is generated by reading information stored in the fuse array 400.

The fuse array 400 may include a plurality of fuses. Information may be stored in each fuse. The fuse array 400 may include a laser fuse, of which the connection is controlled by laser irradiation, or an electrical fuse, of which connection is controlled by an electrical signal. The fuse array 400 may include an anti-fuse, which is characterized by changing from a high resistance state to a low resistance state in response to an electrical signal (e.g., a high-voltage signal). Any one of the types described above may be applied to the fuse array 400. Hereinafter, it is assumed that the fuse array 400 corresponds to an anti-fuse array including an anti-fuse. The fuse array 400 may interchangeably be used with the anti-fuse array 400 (i.e., the fuse array 400 may also be referred to as the anti-fuse array 400). Information stored in an anti-fuse or data read from an anti-fuse may be referred to as fuse data.

The anti-fuse array 400 may have an array structure in which the anti-fuses 410 are respectively at the intersections of rows and columns. For example, when the anti-fuse array 400 has "m" rows and "n" columns, the anti-fuse array 400 may have m*n anti-fuses 410. The anti-fuse array 400 may include "m" word lines WL1 to WLm for access to the anti-fuses 410 in the "m" rows and "n" bit lines BL1 to BLn, which are arranged in correspondence to the "n" columns to transmit information read from the anti-fuses 410 to the sense amplifier 430.

The anti-fuse array 400 may be programmed by changing the state of each of the anti-fuses 410 by applying one of voltage signals VS1 to VSm respectively from the level shifters 420_1 to 420_m to each anti-fuse 410. Each anti-fuse 410 may be changed from a high resistance state into a low resistance state by a program operation and may thus store information. The anti-fuse 410 may have a capacitor structure, i.e., a structure having two conductive layers and a dielectric layer between the two conductive layers, and may be programmed by breaking down the dielectric layer by applying high voltage between the two conductive layers.

After the anti-fuse array 400 is programmed, a read operation may be performed on the anti-fuse array 400 along with the driving of the memory device 120. The read operation on the anti-fuse array 400 may be performed simultaneously with or a certain time after the driving of the memory device 120. A word line select signal may be applied to the anti-fuse array 400 through the word lines WL1 to WLm of the anti-fuse array 400, and information stored in a selected anti-fuse 410 may be provided to the sense amplifier 430 through the bit lines BL1 to BLn. Due to the characteristics of an array structure, information of the anti-fuse array 400 may be randomly accessed by driving the word lines WL1 to WLm and the bit lines BL1 to BLn.

For example, when the word lines WL1 to WLm are sequentially driven, anti-fuses 410 in the first to m-th rows of the anti-fuse array 400 may be sequentially accessed. Information of the anti-fuses 410 that are sequentially accessed may be provided to the sense amplifier 430. The sense amplifier 430 may include at least one sense amplifier circuit. For example, when the anti-fuse array 400 has "n" columns, the sense amplifier 430 may include "n" sense amplifier circuits respectively corresponding to the "n" columns. The "n" sense amplifier circuits may be respectively connected to the "n" bit lines BL1 to BLn.

The sense amplifier 430 may sense and amplify information accessed in the anti-fuse array 400 and output amplified information. Fuse data OUT1 to OUTn output from the sense amplifier 430 may be provided to the register 440. The register 440 may receive the fuse data OUT1 to OUTn in units of rows of the anti-fuse array 400. For example, when one row of the anti-fuse array 400 is selected, the fuse data OUT1 to OUTn respectively from anti-fuses 410 connected to a word line corresponding to the selected row may be provided in parallel to the register 440. The fuse data OUT1 to OUTn stored in the register 440 may include information for a repair information, e.g., a faulty address F_ADDR, which indicates a faulty row address (e.g., FRA in FIG. 2A) and/or a faulty column address (e.g., FCA in FIG. 2B).

The repair circuit 124 in FIG. 3 may compare an access row address applied to the memory device 120 with the faulty row address FRA stored in the repair address storage circuit 350. When the access row address is the same as the faulty row address FRA, the repair circuit 124 may perform a row repair operation by selecting the redundancy row address RRA instead of the faulty row address FRA by using the row repair decoder circuit 210, as shown in FIG. 2A. The repair circuit 124 may compare an access column address applied to the memory device 120 with the faulty column address FCA. When the access column address is the same as the faulty column address FCA, the repair circuit 124 may perform a column repair operation by selecting the redundancy column address RCA instead of the faulty column address FCA by using the column repair decoder circuit 220, as shown in FIG. 2B.

In some embodiments, the repair circuit 124 may perform a row repair operation based on a repair enable signal PRENi. The repair circuit 124 may perform a column repair operation based on the repair enable signal PRENi. For example, the repair circuit 124 may perform a row repair operation based on the repair enable signal PRENi at a high logic level. For example, the repair circuit 124 may perform a column repair operation based on the repair enable signal PRENi at the high logic level. The repair enable signal PRENi is described in detail with reference to the accompanying drawings below.

The pre-decoder circuit 310 may receive N signals each representing one of a plurality of bits representing an address (e.g., a plurality of bits of a row address or a column address) and may output $2^N$ sub signals having one bit value corresponding to one bit state among $2^N$ bit states of the N signals. The bit value of only one sub signal among the $2^N$ sub signals may be 1, and bit values represented by the $2^N$ sub signals may be referred to as a pre-decoded address. The operation of the memory device 120 including the pre-decoder circuit 310, which predecodes two (N=2) signals, is described with reference to FIGS. 5 to 8 below. However, the description below is not limited to the case of N=2 but may be applied to any cases in which N is an integer of at least 2. That is, N may be an integer greater than or equal to 2.

For example, the pre-decoder circuit 310 may decode an access row address provided to the repair circuit 124 into a pre-decoded row address PRA and may decode the faulty row address FRA stored in the repair address storage circuit 350 into a pre-decoded faulty row address PFRA. The pre-decoder circuit 310 may also decode an access column address provided to the repair circuit 124 into a pre-decoded column address PCA and may decode the faulty column address FCA stored in the repair address storage circuit 350 into a pre-decoded faulty column address PFCA.

In some embodiments, the repair circuit 124 may compare the pre-decoded row address PRA with the pre-decoded faulty row address PFRA. When the pre-decoded row address PRA is the same as the pre-decoded faulty row address PFRA, the repair circuit 124 may perform a row repair operation by using the row repair decoder circuit 210 such that the redundancy row address RRA is selected instead of the faulty row address FRA, as shown in FIG. 2A. The repair circuit 124 may compare the pre-decoded column address PCA with the pre-decoded faulty column address PFCA. When the pre-decoded column address PCA is the same as the pre-decoded faulty column address PFCA, the repair circuit 124 may perform a column repair operation by using the column repair decoder circuit 220 such that the redundancy column address RCA is selected instead of the faulty column address FCA, as shown in FIG. 2B.

Figure 5:
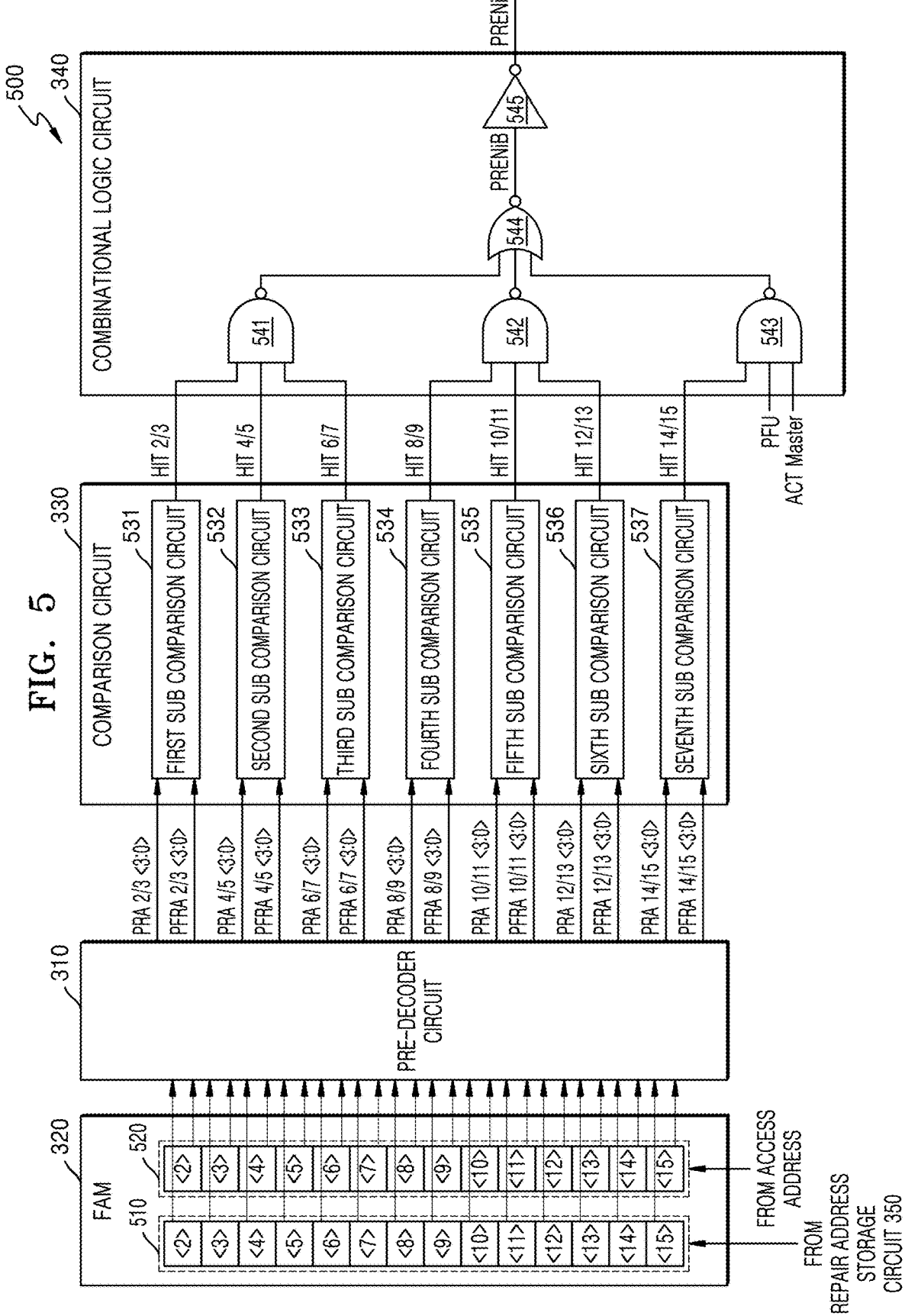
FIG. 5 is a circuit diagram of a unit circuit, which generates a repair enable signal related to a faulty row address, among a plurality of unit circuits forming a repair control circuit of a first repair circuit, according to some embodiments.

FIG. 5 is a circuit diagram of a unit circuit 500, which generates the repair enable signal PRENi related to a faulty row address, among a plurality of unit circuits forming the repair control circuit 300 of the first repair circuit 124(1), according to some embodiments.

The operation of the first repair circuit 124(1) corresponding to the first bank BANK1 is described with reference to FIG. 5.

Referring to FIGS. 3 and 5, the unit circuit 500, which generates one repair enable signal PRENi, may include the pre-decoder circuit 310, the FAM 320 including a first register 510 and a second register 520, the comparison circuit 330 including first to seventh sub comparison circuits 531 to 537, and the combinational logic circuit 340 including first to third NAND logic circuits 541 to 543, a NOR logic circuit 544, and a first inverter 545 (also referred to as a first inverter circuit). For example, the unit circuit 500 may include circuits operating with a 14-bit row address (e.g., RA<15:2>) excluding a lower 2-bit row address (e.g., RA<1:0>) from a 16-bit row address (e.g., RA<15:0>). An example of the unit circuit 500 with respect to the 14-bit row address (RA<15:2>) does not indicate or imply a limitation to the inventive concepts. According to some embodiments, a unit circuit may also be applied to an address having less or more bits than that described in the present embodiment.

In some embodiments, each of the first to fourth banks BANK1 to BANK4 of the memory cell array 122 may include a plurality of memory blocks, which are connected to 64K word lines each corresponding to the row address (RA<15:0>), main word line drivers respectively connected to the memory blocks, and sub word line drivers respectively connected to the memory blocks. The main word line drivers may be connected to a row decoder and may activate main word line driving signals corresponding to a decoded 14-bit row address (RA<15:2>) and activate sub word line driving signals corresponding to a decoded lower 2-bit row address (RA<1:0>). For example, the sub word line drivers may include an inverter circuit, which includes a P-channel metal-oxide semiconductor (PMOS) transistor and an N-channel MOS (NMOS) transistor. A main word line driving signal may be applied to the respective gates of the PMOS transistor and the NMOS transistor, a sub word line driving signal may be applied to the source of the PMOS transistor, and a sub word line is connected to the drain of the PMOS transistor. According to these structures of the main word line drivers and the sub word line drivers, a word line of each of the first to fourth banks BANK1 to BANK4 may be dominantly activated in response to a main word line driving signal. Accordingly, the word line of each of the first to fourth banks BANK1 to BANK4 may be explained as being accessed by a 14-bit row address (RA<15:2>).

The FAM 320 may include the first register 510 and the second register 520 each implemented as a register array. The first register 510 may store a first address provided from the repair address storage circuit 350. The first address may be constituted of 14 bits <15:2>. The second register 520 may store a second address corresponding to an access address applied to the memory device 120. Like the first address, the second address may be constituted of 14 bits <15:2>. The bits <15:2> of each of the first and second addresses respectively stored in the first and second registers 510 and 520 may be provided to the pre-decoder circuit 310. Hereinafter, the first address stored in the first register 510 may be referred to as the faulty row address FRA. The access address or an access row address stored in the second register 520 may be referred to as a row address RA.

The pre-decoder circuit 310 may receive N signals each representing one of a plurality of address bits stored in a register (e.g., the first register 510 or the second register 520) and may output $2^N$ sub signals. Bit values of the $2^N$ sub signals may correspond to one bit state among $2^N$ bit states of N address bits. A bit state may refer to any one of all combinations of the bit values of N bits. For example, in the case of two bits, "00", "01", "10", or "11" may be referred to as one of the bit states of two bits, and two bits may have a total of four bit states.

In other words, the pre-decoder circuit 310 may receive N signals each representing one address bit and may decode the N signals into $2^N$ signals having one bit value corresponding to one bit state among $2^N$ bit states of N address bits.

In some embodiments, the pre-decoder circuit 310 may receive N signals each representing one of a plurality of bits representing a row address and may output $2^N$ sub signals having one bit value corresponding to one bit state among $2^N$ bit states of the N signals.

In some embodiments, the pre-decoder circuit 310 may receive two signals, which represent one bit of a row address RA, and may decode the two signals into four sub signals (PRA<3:0>), which have one bit value corresponding to one bit state among four bit states of two bits of the row address RA. Here, the four sub signals may correspond to a pre-decoded row address PRA<3:0>.

In some embodiments, the pre-decoder circuit 310 may receive N signals each representing one of a plurality of bits representing the faulty row address FRA and may output $2^N$ sub signals having one bit value corresponding to one bit state among $2^N$ bit states of the N signals.

The pre-decoder circuit 310 may receive two signals, which represent one bit of the faulty row address FRA, and may decode the two signals into four sub signals (PFRA<3: 0>), which have one bit value corresponding to one bit state among four bit states of two bits of the faulty row address FRA. Here, the four sub signals may correspond to a pre-decoded faulty row address PFRA<3:0>.

Figure 6:
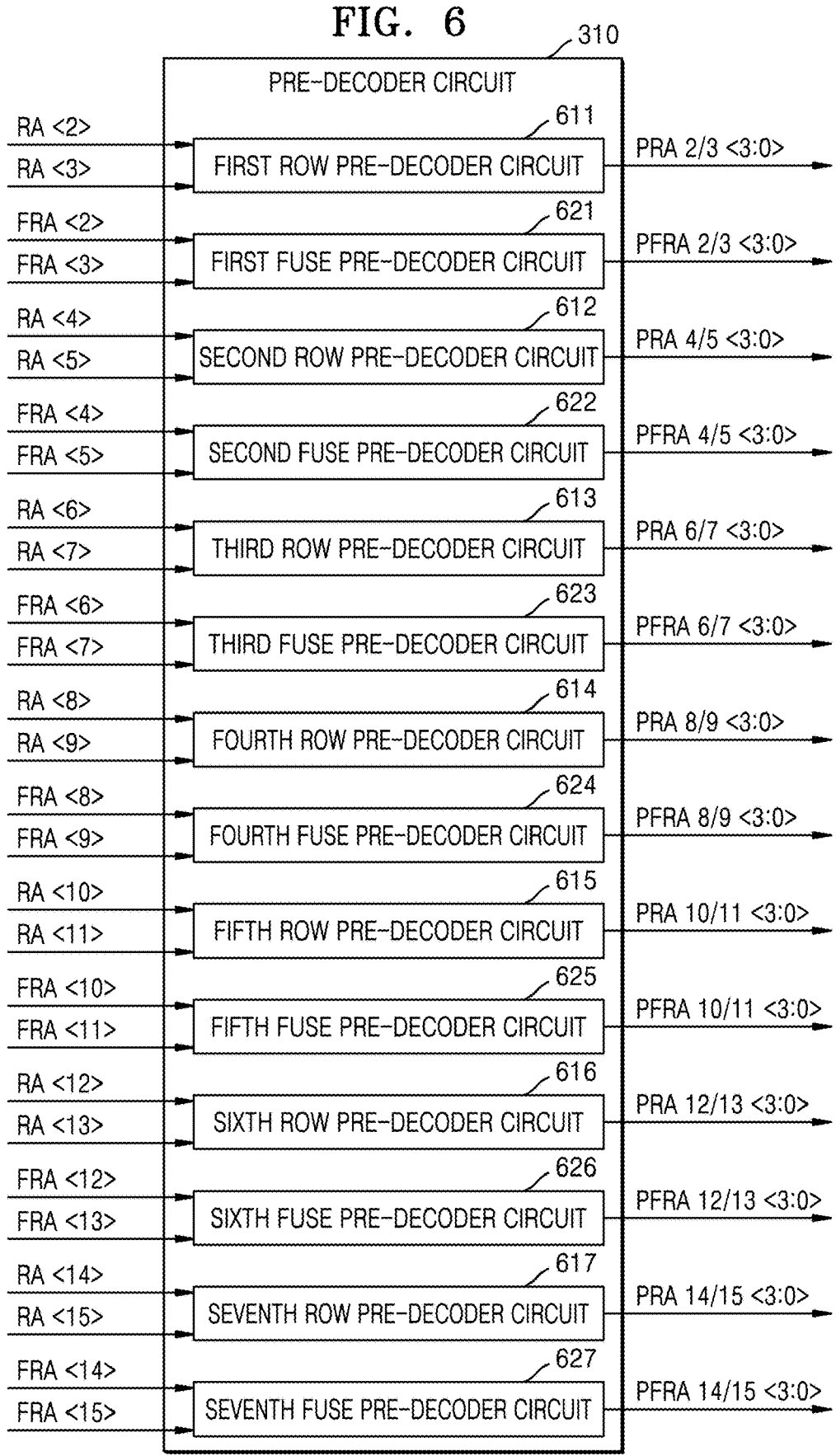
FIG. 6 is a diagram of a pre-decoder circuit among a plurality of unit circuits forming a repair control circuit of a first repair circuit, according to some embodiments.

FIG. 6 is a diagram of the pre-decoder circuit 310 among a plurality of unit circuits forming the repair control circuit 300 of the first repair circuit 124(1), according to some embodiments.

Referring to FIG. 6, the pre-decoder circuit 310 may include first to seventh row pre-decoder circuits 611 to 617 and first to seventh fuse pre-decoder circuits 621 to 627.

Each of the first to seventh row pre-decoder circuits 611 to 617 may receive two signals, which represent one bit of the row address RA, and may decode the two signals into four sub signals (PRA<3:0>), which have one bit value corresponding to one bit state among four bit states of two bits of the row address RA. Here, the four sub signals may correspond to the pre-decoded row address PRA<3:0>.

The first row pre-decoder circuit 611 may receive a signal RA<2> representing the first bit of the row address RA and a signal RA<3> representing the second bit of the row address RA and may output four sub signals (PRA 2/3<3:0>) representing a bit state of the first and second bits of the row address RA.

In other words, the first row pre-decoder circuit 611 may receive the signal RA<2> representing the first bit of the row address RA and the signal RA<3> representing the second bit of the row address RA and may output bits <3:0> of a first pre-decoded row address PRA 2/3. Here, the bits <3:0> of the first pre-decoded row address PRA 2/3 may correspond to four sub signals having one bit value, and the four sub signals may be respectively referred to as a first sub signal PRA 2/3 0, a second sub signal PRA 2/3 1, a third sub signal PRA 2/3 2, and a fourth sub signal PRA 2/3 3.

Similarly, the second row pre-decoder circuit 612 may receive a signal RA<4> representing the third bit of the row address RA and a signal RA<5> representing the fourth bit of the row address RA and may output bits <3:0> of a second pre-decoded row address PRA 4/5. The third row pre-decoder circuit 613 may receive a signal RA<6> representing the fifth bit of the row address RA and a signal RA<7> representing the sixth bit of the row address RA and may output bits <3:0> of a third pre-decoded row address PRA 6/7. The fourth row pre-decoder circuit 614 may receive a signal RA<8> representing the seventh bit of the row address RA and a signal RA<9> representing the eighth bit of the row address RA and may output bits <3:0> of a fourth pre-decoded row address PRA 8/9. The fifth row pre-decoder circuit 615 may receive a signal RA<10> representing the ninth bit of the row address RA and a signal RA<11> representing the tenth bit of the row address RA and may output bits <3:0> of a fifth pre-decoded row address PRA 10/11. The sixth row pre-decoder circuit 616 may receive a signal RA<12> representing the 11th bit of the row address RA and a signal RA<13> representing the 12th bit of the row address RA and may output bits <3:0> of a sixth pre-decoded row address PRA 12/13. The seventh row pre-decoder circuit 617 may receive a signal RA<14> representing the 13th bit of the row address RA and a signal RA<15> representing the 14th bit of the row address RA and may output bits <3:0> of a seventh pre-decoded row address PRA 14/15.

Each of the first to seventh fuse pre-decoder circuits 621 to 627 may receive two signals, which represent one bit of the faulty row address FRA, and may decode the two signals into four sub signals (PFRA<3:0>), which have one bit value corresponding to one bit state among four bit states of two bits of the faulty row address FRA. Here, the four sub signals may correspond to the pre-decoded faulty row address PFRA<3:0>.

The first fuse pre-decoder circuit 621 may receive a signal FRA<2> representing the first bit of the faulty row address FRA and a signal FRA<3> representing the second bit of the faulty row address FRA and may output four sub signals (PFRA 2/3<3:0>) representing a bit state of the first and second bits of the faulty row address FRA.

In other words, the first fuse pre-decoder circuit 621 may receive the signal FRA<2> representing the first bit of the faulty row address FRA and the signal FRA<3> representing the second bit of the faulty row address FRA and may output bits <3:0> of a first pre-decoded faulty row address PFRA 2/3. Here, the bits <3:0> of the first pre-decoded faulty row address PFRA 2/3 may correspond to four sub signals having one bit value, and the four sub signals may be respectively referred to as a fifth sub signal PFRA 2/3 0, a sixth sub signal PFRA 2/3 1, a seventh sub signal PFRA 2/3 2, and an eighth sub signal PFRA 2/3 3.

Similarly, the second fuse pre-decoder circuit 622 may receive a signal FRA<4> representing the third bit of the faulty row address FRA and a signal FRA<5> representing the fourth bit of the faulty row address FRA and may output bits <3:0> of a second pre-decoded faulty row address PFRA 4/5. The third fuse pre-decoder circuit 623 may receive a signal FRA<6> representing the fifth bit of the faulty row address FRA and a signal FRA<7> representing the sixth bit of the faulty row address FRA and may output bits <3:0> of a third pre-decoded faulty row address PFRA 6/7. The fourth fuse pre-decoder circuit 624 may receive a signal FRA<8> representing the seventh bit of the faulty row address FRA and a signal FRA<9> representing the eighth bit of the faulty row address FRA and may output bits <3:0> of a fourth pre-decoded faulty row address PFRA 8/9. The fifth fuse pre-decoder circuit 625 may receive a signal FRA<10> representing the ninth bit of the faulty row address FRA and a signal FRA<11> representing the tenth bit of the faulty row address FRA and may output bits <3:0> of a fifth pre-decoded faulty row address PFRA 10/11. The sixth fuse pre-decoder circuit 626 may receive a signal FRA<12> representing the 11th bit of the faulty row address FRA and a signal FRA<13> representing the 12th bit of the faulty row address FRA and may output bits <3:0> of a sixth pre-decoded faulty row address PFRA 12/13. The seventh fuse pre-decoder circuit 627 may receive a signal FRA<14> representing the 13th bit of the faulty row address FRA and a signal FRA<15> representing the 14th bit of the faulty row address FRA and may output bits <3:0> of a seventh pre-decoded faulty row address PFRA 14/15.

Figure 7A:
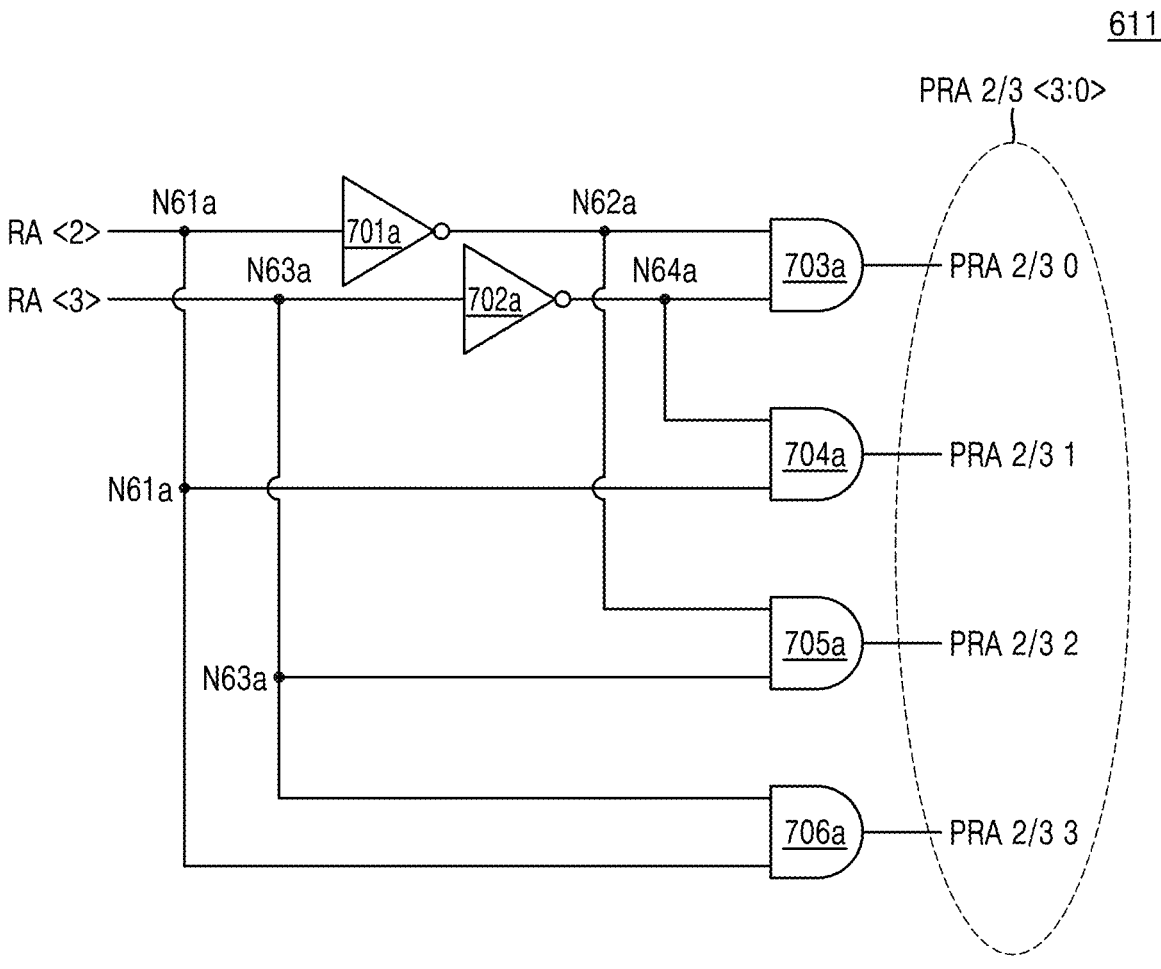
FIG. 7A is a diagram illustrating an equivalent circuit of a first row pre-decoder circuit included in a pre-decoder circuit, according to some embodiments.
Figure 7C:
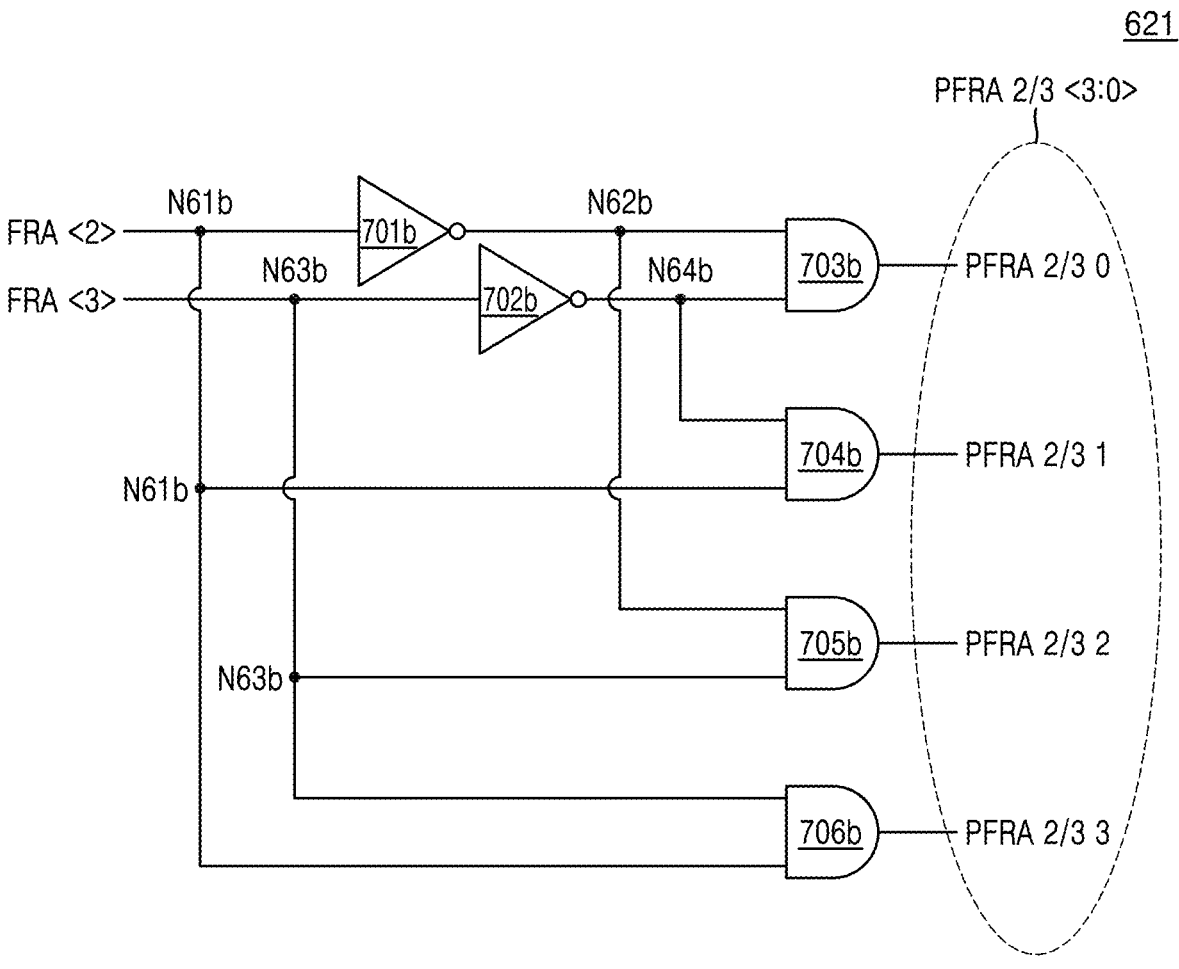
FIG. 7C is a diagram illustrating an equivalent circuit of a first fuse pre-decoder circuit included in a pre-decoder circuit, according to some embodiments.

FIG. 7A is a diagram illustrating an equivalent circuit of the first row pre-decoder circuit 611 included in the pre-decoder circuit 310, according to some embodiments. FIG. 7B is a diagram illustrating the operation of the first row pre-decoder circuit 611 according to some embodiments. FIG. 7C is a diagram illustrating an equivalent circuit of the first fuse pre-decoder circuit 621 included in the pre-decoder circuit 310, according to some embodiments. FIG. 7D is a diagram illustrating the operation of the first fuse pre-decoder circuit 621 according to some embodiments.

Referring to FIG. 7A, the first row pre-decoder circuit 611 may include a second inverter circuit 701*a*, a third inverter circuit 702*a*, and first to fourth AND logic circuits 703*a* to 706*a*.

The second inverter circuit 701*a* may be connected between a first node N61*a* and a second node N62*a*. The signal RA<2> representing the first bit of the row address RA is applied to the first node N61*a*. The third inverter circuit 702*a* may be connected between a third node N63*a* and a fourth node N64*a*. The signal RA<3> representing the second bit of the row address RA is applied to the third node N63*a*. The first AND logic circuit 703*a* may be connected to the second node N62*a*, the fourth node N64*a*, and a first output node that outputs the first sub signal PRA 2/3 0 representing the first bit among the bits <3:0> of the first pre-decoded row address PRA 2/3. The second AND logic circuit 704*a* may be connected to the first node N61*a*, the fourth node N64*a*, and a second output node that outputs the second sub signal PRA 2/3 1 representing the second bit among the bits <3:0> of the first pre-decoded row address PRA 2/3. The third AND logic circuit 705*a* may be connected to the second node N62*a*, the third node N63*a*, and a third output node that outputs the third sub signal PRA 2/3 2 representing the third bit among the bits <3:0> of the first pre-decoded row address PRA 2/3. The fourth AND logic circuit 706*a* may be connected to the first node N61*a*, the third node N63*a*, and a fourth output node that outputs the fourth sub signal PRA 2/3 3 representing the fourth bit among the bits <3:0> of the first pre-decoded row address PRA 2/3.

FIG. 7B shows the bit values of the first sub signal PRA 2/3 0, the bit values of the second sub signal PRA 2/3 1, the bit values of the third sub signal PRA 2/3 2, and the bit values of the fourth sub signal PRA 2/3 0, which are output from the first row pre-decoder circuit 611, with respect to the bit values of the signal RA<2> representing the first bit of the row address RA and the bit values of the signal RA<3> representing the second bit of the row address RA, which are input to the first row pre-decoder circuit 611.

Referring to FIG. 7B, it may be seen that when the bit value of the first bit (RA<2>) is 0 and the bit value of the second bit (RA<3>) is 0, the bit value of the first sub signal PRA 2/3 0, which represents the first bit among the bits <3:0> of the first pre-decoded row address PRA 2/3, becomes 1 and the bit value of each of the second sub signal PRA 2/3 1, the third sub signal PRA 2/3 2, and the fourth sub signal PRA 2/3 3 becomes 0, according to the operation of the first row pre-decoder circuit 611. It may also be seen that when the bit value of the first bit (RA<2>) is 1 and the bit value of the second bit (RA<3>) is 0, the bit value of the second sub signal PRA 2/3 1, which represents the second bit among the bits <3:0> of the first pre-decoded row address PRA 2/3, becomes 1 and the bit value of each of the first sub signal PRA 2/3 0, the third sub signal PRA 2/3 2, and the fourth sub signal PRA 2/3 3 becomes 0, according to the operation of the first row pre-decoder circuit 611. It may also be seen that when the bit value of the first bit (RA<2>) is 0 and the bit value of the second bit (RA<3>) is 1, the bit value of the third sub signal PRA 2/3 2, which represents the third bit among the bits <3:0> of the first pre-decoded row address PRA 2/3, becomes 1 and the bit value of each of the first sub signal PRA 2/3 0, the second sub signal PRA 2/3 1, and the fourth sub signal PRA 2/3 3 becomes 0, according to the operation of the first row pre-decoder circuit 611. It may also be seen that when the bit value of the first bit (RA<2>) is 1 and the bit value of the second bit (RA<3>) is 1, the bit value of the fourth sub signal PRA 2/3 3, which represents the fourth bit among the bits <3:0> of the first pre-decoded row address PRA 2/3, becomes 1 and the bit value of each of the first sub signal PRA 2/3 0, the second sub signal PRA 2/3 1, and the third sub signal PRA 2/3 2 becomes 0, according to the operation of the first row pre-decoder circuit 611.

In other words, the first row pre-decoder circuit 611 may decode the row address RA having two bits into the pre-decoded row address PRA having four bits such that the bit value of only one sub signal among four sub signals representing a bit state of the two bits of the row address RA becomes 1.

Referring to FIG. 7C, the first fuse pre-decoder circuit 621 may include a fourth inverter circuit 701*b*, a fifth inverter circuit 702*b*, and fifth to eighth AND logic circuits 703*b* to 706*b*.

The fourth inverter circuit 701*b* may be connected between a fifth node N61*b* and a sixth node N62*b*. The signal FRA<2> representing the first bit of the faulty row address FRA is applied to the fifth node N61*b*. The fifth inverter circuit 702*b* may be connected between a seventh node N63*b* and an eighth node N64*b*. The signal FRA<3> representing the second bit of the faulty row address FRA is applied to the seventh node N63*b*. The fifth AND logic circuit 703*b* may be connected to the sixth node N62*b*, the eighth node N64*b*, and a fifth output node that outputs the fifth sub signal PFRA 2/3 0 representing the first bit among the bits <3:0> of the first pre-decoded faulty row address PFRA 2/3. The sixth AND logic circuit 704*b* may be connected to the fifth node N61*b*, the eighth node N64*b*, and a sixth output node that outputs the sixth sub signal PFRA 2/3 1 representing the second bit among the bits <3:0> of the first pre-decoded faulty row address PFRA 2/3. The seventh AND logic circuit 705*b* may be connected to the sixth node N62*b*, the seventh node N63*b*, and a seventh output node that outputs the seventh sub signal PFRA 2/3 2 representing the third bit among the bits <3:0> of the first pre-decoded faulty row address PFRA 2/3. The eighth AND logic circuit 706*b* may be connected to the fifth node N61*b*, the seventh node N63*b*, and an eighth output node that outputs the eighth sub signal PFRA 2/3 3 representing the fourth bit among the bits <3:0> of the first pre-decoded faulty row address PFRA 2/3.

FIG. 7D shows the bit values of the fifth sub signal PFRA 2/3 0, the bit values of the sixth sub signal PFRA 2/3 1, the bit values of the seventh sub signal PFRA 2/3 2, and the bit values of the eighth sub signal PFRA 2/3 3, which are output from the first fuse pre-decoder circuit 621, with respect to the bit values of the signal FRA<2> representing the first bit of the faulty row address FRA and the bit values of the signal FRA<3> representing the second bit of the faulty row address FRA, which are input to the first fuse pre-decoder circuit 621.

Referring to FIG. 7D, it may be seen that when the bit value of the first bit (FRA<2>) is 0 and the bit value of the second bit (FRA<3>) is 0, the bit value of the fifth sub signal PFRA 2/3 0, which represents the first bit among the bits <3:0> of the first pre-decoded faulty row address PFRA 2/3, becomes 1 and the bit value of each of the sixth sub signal PFRA 2/3 1, the seventh sub signal PFRA 2/3 2, and the eighth sub signal PFRA 2/3 3 becomes 0, according to the operation of the first fuse pre-decoder circuit 621. It may also be seen that when the bit value of the first bit (FRA<2>) is 1 and the bit value of the second bit (FRA<3>) is 0, the bit value of the sixth sub signal PFRA 2/3 1, which represents the second bit among the bits <3:0> of the first pre-decoded faulty row address PFRA 2/3, becomes 1 and the bit value of each of the fifth sub signal PFRA 2/3 0, the seventh sub signal PFRA 2/3 2, and the eighth sub signal PFRA 2/3 3 becomes 0, according to the operation of the first fuse pre-decoder circuit 621. It may also be seen that when the bit value of the first bit (FRA<2>) is 0 and the bit value of the second bit (FRA<3>) is 1, the bit value of the seventh sub signal PFRA 2/3 2, which represents the third bit among the bits <3:0> of the first pre-decoded faulty row address PFRA 2/3, becomes 1 and the bit value of each of the fifth sub signal PFRA 2/3 0, the sixth sub signal PFRA 2/3 1, and the eighth sub signal PFRA 2/3 3 becomes 0, according to the operation of the first fuse pre-decoder circuit 621. It may also be seen that when the bit value of the first bit (FRA<2>) is 1 and the bit value of the second bit (FRA<3>) is 1, the bit value of the eighth sub signal PFRA 2/3 3, which represents the fourth bit among the bits <3:0> of the first pre-decoded faulty row address PFRA 2/3, becomes 1 and the bit value of each of the fifth sub signal PFRA 2/3 0, the sixth sub signal PFRA 2/3 1, and the seventh sub signal PFRA 2/3 2 becomes 0, according to the operation of the first fuse pre-decoder circuit 621.

In other words, the first fuse pre-decoder circuit 621 may output four sub signals such that the bit value of only one sub signal among the four sub signals representing a bit state of the two bits of the faulty row address FRA becomes 1.

Referring back to FIG. 5, the comparison circuit 330 may compare a bit value of $2^N$ sub signals representing a pre-decoded row address with a bit value of $2^N$ sub signals representing a pre-decoded faulty row address and may output a hit signal indicating match or mismatch between a bit value of N bits of a faulty row address and a bit value of N bits of a row address, where N is a natural number.

Referring to FIG. 5, the comparison circuit 330 may include the first to seventh sub comparison circuits 531 to 537. Each of the first to seventh sub comparison circuits 531 to 537 may compare a bit value of the bits <3:0> of the pre-decoded row address PRA with a bit value of the bits <3:0> of the pre-decoded faulty row address PFRA and may output a hit signal HIT, and the bit values may be received from the pre-decoder circuit 310.

The pre-decoded row address PRA may represent information about a plurality of bits (e.g., bit <2> and bit <3>) of the row address RA stored in the second register 520. The pre-decoded faulty row address PFRA may represent information about a plurality of bits (e.g., bit <2> and bit <3>) of the faulty row address FRA stored in the first register 510. One hit signal HIT (e.g., HIT 2/3) may be output at a high logic level when respective bit values of a plurality of bits (e.g., PFRA 2/3<3:0>) of a pre-decoded faulty row address match with respective bit values of a plurality of bits (e.g., PRA 2/3<3:0>) of a pre-decoded row address and may be output at a low logic level when there is mismatch between the bit values of the bits of the pre-decoded faulty row address and the bit values of the bits of the pre-decoded row address. However, embodiments are not limited thereto. For example, in some other embodiments, one hit signal HIT (e.g., HIT 2/3) may be output at a low logic level when respective bit values of a plurality of bits (e.g., PFRA 2/3<3:0>) of a pre-decoded faulty row address match with respective bit values of a plurality of bits (e.g., PRA 2/3<3:0>) of a pre-decoded row address and may be output at a high logic level when there is mismatch between the bit values of the bits of the pre-decoded faulty row address and the bit values of the bits of the pre-decoded row address.

Referring to FIG. 5, the first sub comparison circuit 531 may compare respective bit values of the bits <3:0> of the first pre-decoded row address PRA 2/3 received from the pre-decoder circuit 310 with respective bit values of the bits <3:0> of the first pre-decoded faulty row address PFRA 2/3 received from the pre-decoder circuit 310 and may output a first hit signal HIT 2/3. At this time, the bits <3:0> of the first pre-decoded row address PRA 2/3 may represent information about the bits <3:2> of the row address RA stored in the second register 520. The bits <3:0> of the first pre-decoded faulty row address PFRA 2/3 may represent information about the bits <3:2> of the faulty row address FRA stored in the first register 510. The first hit signal HIT 2/3 may be output at a high logic level when respective bit values of the bits <3:0> of the first pre-decoded row address PRA 2/3 match with respective bit values of the bits <3:0> of the first pre-decoded faulty row address PFRA 2/3 and may be output at a low logic level when there is mismatch between the bit values. However, embodiments are not limited thereto. For example, in some other embodiments, the first hit signal HIT 2/3 may be output at a low logic level when the respective bit values of the bits <3:0> of the first pre-decoded row address PRA 2/3 match with the respective bit values of the bits <3:0> of the first pre-decoded faulty row address PFRA 2/3 and may be output at a high logic level when there is mismatch between the bit values.

The second sub comparison circuit 532 may compare respective bit values of the bits <3:0> of the second pre-decoded row address PRA 4/5 received from the pre-decoder circuit 310 with respective bit values of the bits <3:0> of the second pre-decoded faulty row address PFRA 4/5 received from the pre-decoder circuit 310 and may output a second hit signal HIT 4/5. At this time, the bits <3:0> of the second pre-decoded row address PRA 4/5 may represent information about the bits <5:4> of the row address RA stored in the second register 520. The bits <3:0> of the second pre-decoded faulty row address PFRA 4/5 may represent information about the bits <5:4> of the faulty row address FRA stored in the first register 510.

The third sub comparison circuit 533 may compare respective bit values of the bits <3:0> of the third pre-decoded row address PRA 6/7 received from the pre-decoder circuit 310 with respective bit values of the bits <3:0> of the third pre-decoded faulty row address PFRA 6/7 received from the pre-decoder circuit 310 and may output a third hit signal HIT 6/7. At this time, the bits <3:0> of the third pre-decoded row address PRA 6/7 may represent information about the bits <7:6> of the row address RA stored in the second register 520. The bits <3:0> of the third pre-decoded faulty row address PFRA 6/7 may represent information about the bits <7:6> of the faulty row address FRA stored in the first register 510.

The fourth sub comparison circuit 534 may compare respective bit values of the bits <3:0> of the fourth pre-decoded row address PRA 8/9 received from the pre-decoder circuit 310 with respective bit values of the bits <3:0> of the fourth pre-decoded faulty row address PFRA 8/9 received from the pre-decoder circuit 310 and may output a fourth hit signal HIT 8/9. At this time, the bits <3:0> of the fourth pre-decoded row address PRA 8/9 may represent information about the bits <9:8> of the row address RA stored in the second register 520. The bits <3:0> of the fourth pre-decoded faulty row address PFRA 8/9 may represent information about the bits <9:8> of the faulty row address FRA stored in the first register 510.

The fifth sub comparison circuit 535 may compare respective bit values of the bits <3:0> of the fifth pre-decoded row address PRA 10/11 received from the pre-decoder circuit 310 with respective bit values of the bits <3:0> of the fifth pre-decoded faulty row address PFRA 10/11 received from the pre-decoder circuit 310 and may output a fifth hit signal HIT 10/11. At this time, the bits <3:0> of the fifth pre-decoded row address PRA 10/11 may represent information about the bits <11:10> of the row address RA stored in the second register 520. The bits <3:0> of the fifth pre-decoded faulty row address PFRA 10/11 may represent information about the bits <11:10> of the faulty row address FRA stored in the first register 510.

The sixth sub comparison circuit 536 may compare respective bit values of the bits <3:0> of the sixth pre-decoded row address PRA 12/13 received from the pre-decoder circuit 310 with respective bit values of the bits <3:0> of the sixth pre-decoded faulty row address PFRA 12/13 received from the pre-decoder circuit 310 and may output a sixth hit signal HIT 12/13. At this time, the bits <3:0> of the sixth pre-decoded row address PRA 12/13 may represent information about the bits <13:12> of the row address RA stored in the second register 520. The bits <3:0> of the sixth pre-decoded faulty row address PFRA 12/13 may represent information about the bits <13:12> of the faulty row address FRA stored in the first register 510.

The seventh sub comparison circuit 537 may compare respective bit values of the bits <3:0> of the seventh pre-decoded row address PRA 14/15 received from the pre-decoder circuit 310 with respective bit values of the bits <3:0> of the seventh pre-decoded faulty row address PFRA 14/15 received from the pre-decoder circuit 310 and may output a seventh hit signal HIT 14/15. At this time, the bits <3:0> of the seventh pre-decoded row address PRA 14/15 may represent information about the bits <15:14> of the row address RA stored in the second register 520. The bits <3:0> of the seventh pre-decoded faulty row address PFRA 14/15 may represent information about the bits <15:14> of the faulty row address FRA stored in the first register 510.

Each of the hit signals HIT 2/3 to HIT 14/15 of the comparison circuit 330 may be output at a high logic level when the bit value of the bits <3:0> of the pre-decoded row address PRA and the bit value of the bits <3:0> of the pre-decoded faulty row address PFRA, which are input to one of the first to seventh sub comparison circuits 531 to 537, match with each other and may be output at a low logic level when there is mismatch between the bit values. However, embodiments are not limited thereto. For example, in some other embodiments, each of the hit signals HIT 2/3 to HIT 14/15 of the comparison circuit 330 may be output at a low logic level when the bit value of the bits <3:0> of the pre-decoded row address PRA and the bit value of the bits <3:0> of the pre-decoded faulty row address PFRA, which are input to one of the first to seventh sub comparison circuits 531 to 537, match with each other and may be output at a high logic level when there is mismatch between the bit values.

Figure 8A:
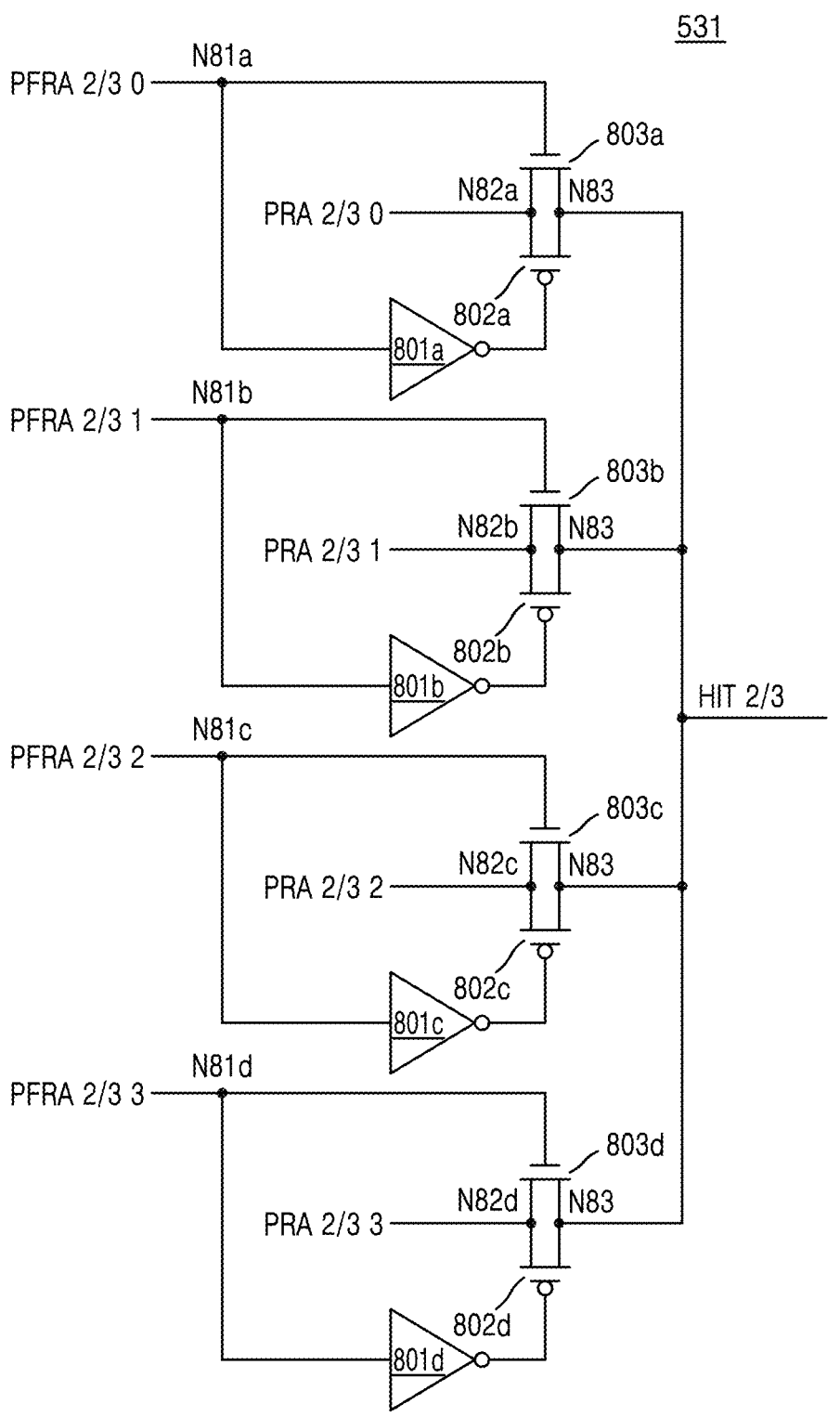
FIG. 8A is a diagram illustrating an equivalent circuit of a first sub comparison circuit included in a comparison circuit, according to some embodiments.

FIG. 8A is a diagram illustrating an equivalent circuit of the first sub comparison circuit 531 included in the comparison circuit 330, according to some embodiments. FIG. 8B is a diagram illustrating the operation of the first sub comparison circuit 531 according to some embodiments.

The first sub comparison circuit 531 may include inverter circuits (e.g., 801a, 801b, 801c, and 801d), P-type transistors (e.g., 802a, 802b, 802c, and 802d), and N-type transistors (e.g., 803a, 803b, 803c, and 803d).

Referring to FIG. 8A, the first sub comparison circuit 531 may include a sixth inverter circuit 801a, a seventh inverter circuit 801b, an eighth inverter circuit 801c, a ninth inverter circuit 801d, a first P-type transistor 802a, a second P-type transistor 802b, a third P-type transistor 802c, a fourth P-type transistor 802d, a first N-type transistor 803a, a second N-type transistor 803b, a third N-type transistor 803c, and a fourth N-type transistor 803d.

The sixth inverter circuit 801a may be connected between a ninth node N81a, to which the fifth sub signal PFRA 2/3 0 is applied, and the gate terminal of the first P-type transistor 802a. The gate terminal of the first P-type transistor 802a may be connected to the output terminal of the sixth inverter circuit 801a. The first terminal of the first P-type transistor 802a may be connected to a tenth node N82a, to which the first sub signal PRA 2/3 0 is applied. The second terminal of the first P-type transistor 802a may be connected to an 11th node N83 from which the first hit signal HIT 2/3 is output. The gate terminal of the first N-type transistor 803a may be connected to the ninth node N81a, to which the fifth sub signal PFRA 2/3 0 is applied. The first terminal of the first N-type transistor 803a may be connected to the tenth node N82a, to which the first sub signal PRA 2/3 0 is applied. The second terminal of the first N-type transistor 803a may be connected to the 11th node N83 from which the first hit signal HIT 2/3 is output.

The seventh inverter circuit 801b may be connected between a 12th node N81b, to which the sixth sub signal PFRA 2/3 1 is applied, and the gate terminal of the second P-type transistor 802b. The gate terminal of the second P-type transistor 802b may be connected to the output terminal of the seventh inverter circuit 801b. The first terminal of the second P-type transistor 802b may be connected to a 13th node N82b, to which the second sub signal PRA 2/3 1 is applied. The second terminal of the second P-type transistor 802b may be connected to the 11th node N83 from which the first hit signal HIT 2/3 is output. The gate terminal of the second N-type transistor 803b may be connected to the 12th node N81b, to which the sixth sub signal PFRA 2/3 1 is applied. The first terminal of the second N-type transistor 803b may be connected to the 13th node N82b, to which the second sub signal PRA 2/3 1 is applied. The second terminal of the second N-type transistor 803b may be connected to the 11th node N83 from which the first hit signal HIT 2/3 is output.

The eighth inverter circuit 801c may be connected between a 14th node N81c, to which the seventh sub signal PFRA 2/3 2 is applied, and the gate terminal of the third P-type transistor 802c. The gate terminal of the third P-type transistor 802c may be connected to the output terminal of the eighth inverter circuit 801c. The first terminal of the third P-type transistor 802c may be connected to a 15th node N82c, to which the third sub signal PRA 2/3 2 is applied. The second terminal of the third P-type transistor 802c may be connected to the 11th node N83 from which the first hit signal HIT 2/3 is output. The gate terminal of the third N-type transistor 803c may be connected to the 14th node N81c, to which the seventh sub signal PFRA 2/3 2 is applied. The first terminal of the third N-type transistor 803c may be connected to the 15th node N82c, to which the third sub signal PRA 2/3 2 is applied. The second terminal of the third N-type transistor 803c may be connected to the 11th node N83 from which the first hit signal HIT 2/3 is output.

The ninth inverter circuit 801d may be connected between a 16th node N81d, to which the eighth sub signal PFRA 2/3 3 is applied, and the gate terminal of the fourth P-type transistor 802d. The gate terminal of the fourth P-type transistor 802d may be connected to the output terminal of the ninth inverter circuit 801d. The first terminal of the fourth P-type transistor 802d may be connected to a 17th node N82*d*, to which the fourth sub signal PRA 2/3 3 is applied. The second terminal of the fourth P-type transistor 802*d* may be connected to the 11th node N83 from which the first hit signal HIT 2/3 is output. The gate terminal of the fourth N-type transistor 803*d* may be connected to the 16th node N81*d*, to which the eighth sub signal PFRA 2/3 3 is applied. The first terminal of the fourth N-type transistor 803*d* may be connected to the 17th node N82*d*, to which the fourth sub signal PRA 2/3 3 is applied. The second terminal of the fourth N-type transistor 803*d* may be connected to the 11th node N83 from which the first hit signal HIT 2/3 is output.

FIG. 8B shows the bit values of the first hit signal HIT 2/3 of the first sub comparison circuit 531 with respect to the bit values of the bits <3:0> of the first pre-decoded row address PRA 2/3 and the bit values of the bits <3:0> of the first pre-decoded faulty row address PFRA 2/3.

Referring to FIG. 8B, it may be seen that the bit value of the first hit signal HIT 2/3 is 1 when all of the respective bit values of the bits <3:0> of the first pre-decoded row address PRA 2/3 are the same as the respective bit values of the bits <3:0> of the first pre-decoded faulty row address PFRA 2/3. It may also be seen that the bit value of the first hit signal HIT 2/3 is 0 when any one of the respective bit values of the bits <3:0> of the first pre-decoded row address PRA 2/3 is not the same as a corresponding bit value among the respective bit values of the bits <3:0> of the first pre-decoded faulty row address PFRA 2/3

Referring back to FIG. 5, the combinational logic circuit 340 may include the first to third NAND logic circuits 541 to 543, the NOR logic circuit 544, and the first inverter 545. Each of the first to third NAND logic circuits 541 to 543 may receive at least one of the first to seventh hit signals HIT 2/3 to HIT 14/15 from the comparison circuit 330. The NOR logic circuit 544 may output a pre-repair enable signal PRENiB. The first inverter 545 may output the repair enable signal PRENi.

The first NAND logic circuit 541 may receive the first hit signal HIT 2/3, the second hit signal HIT 4/5, and the third hit signal HIT 6/7. The second NAND logic circuit 542 may receive the fourth hit signal HIT 8/9, the fifth hit signal HIT 10/11, and the sixth hit signal HIT 12/13. The third NAND logic circuit 543 may receive the seventh hit signal HIT 14/15, an act master signal (ACT Master), and a master fuse inform signal PFU. The act master signal and the master fuse inform signal PFU may activate a memory cell and may be received through the command and address CA of the test host 112 together with the row address RA (e.g., see FIG. 1). The NOR logic circuit 544 may receive respective outputs of the first NAND logic circuit 541, the second NAND logic circuit 542, and the third NAND logic circuit 543 and may output the pre-repair enable signal PRENiB. The first inverter 545 may receive the pre-repair enable signal PRENiB and output the repair enable signal PRENi.

The combinational logic circuit 340 may generate the pre-repair enable signal PRENiB at a high logic level and the repair enable signal PRENi at a low logic level when all of the first to seventh hit signals HIT 2/3 to HIT 14/15 are at a high logic level. Based on the pre-repair enable signal PRENiB at a high logic level and the repair enable signal PRENi at a low logic level, it may be determined that the first address bits stored in the first register 510 match with the second address bits stored in the second register 520.

When any one of the first to seventh hit signals HIT 2/3 to HIT 14/15 is at a low logic level, the combinational logic circuit 340 may generate the pre-repair enable signal PRENiB at a low logic level and the repair enable signal PRENi at a high logic level. Based on the pre-repair enable signal PRENiB at a low logic level and the repair enable signal PRENi at a high logic level, it may be determined that the first address bits stored in the first register 510 do not match with the second address bits stored in the second register 520.

According to some embodiments, the memory device 120 may compare pre-decoded addresses, which are generated by the pre-decoder circuit 310, and accordingly, the number of toggling lines for input addresses may be reduced by the amount of pre-decoding. In addition, the number of hit signals to be output may also be reduced. For example, the number of hit signals to be output is 14 when the pre-decoder circuit 310 is not provided in FIG. 5. However, according to some embodiments, the number of hit signals (e.g., HIT 2/3 to HIT 14/15) to be output is 7 because the memory device 120 compares pre-decoded addresses, which are generated by the pre-decoder circuit 310.

According to the inventive concepts, because the number of hit signals to be output is reduced, the number of toggling lines related to hit-signal output may also be reduced. With the reduction of the number of lines, related gate loading may also be reduced, and accordingly, current required for a repair circuit device may also be reduced.

According to the inventive concepts, due to the reduction of gate loading and the number of hit signals to be output, the number of logic circuits of a combinational logic circuit (e.g., the combinational logic circuit 340 in FIG. 5), which collates hit signals, may decrease, and thus, a timing margin associated with the hit signals may be improved.

Figure 9:
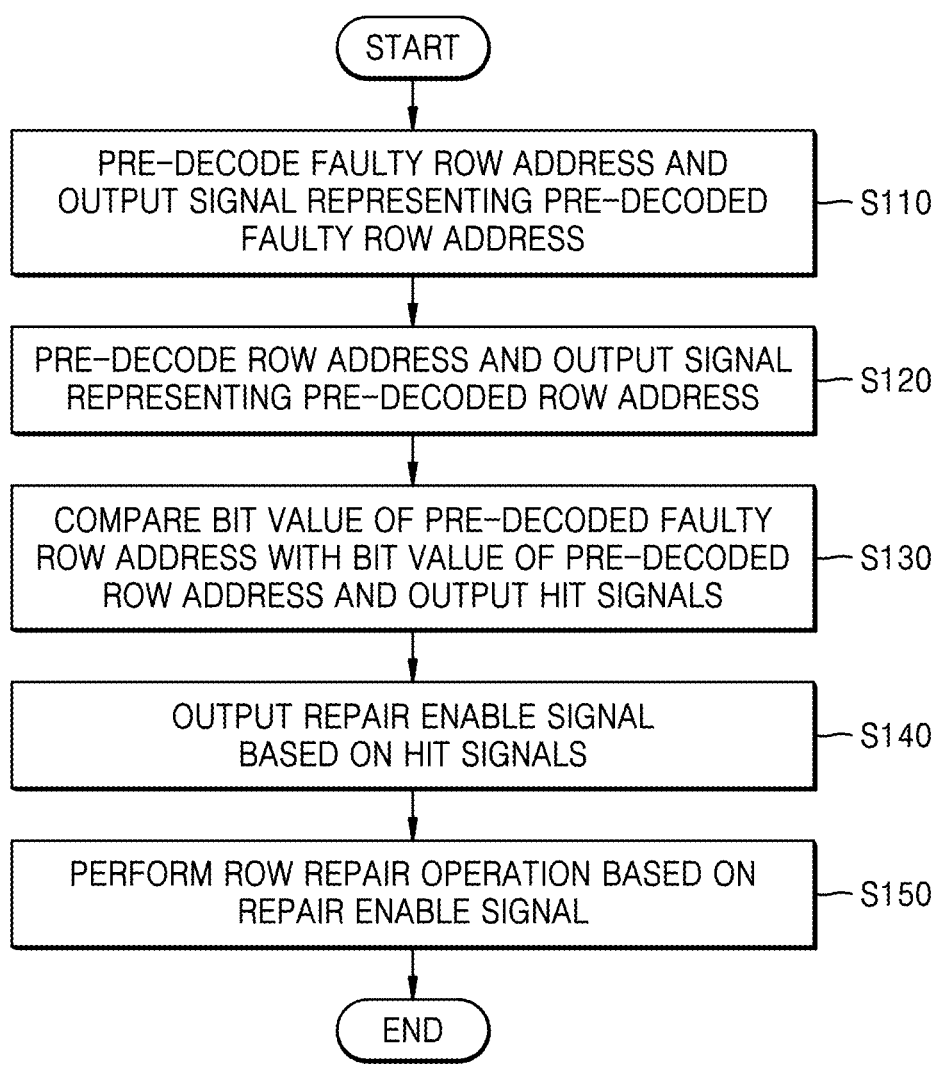
FIG. 9 is a flowchart of an operating method of a memory device, according to some embodiments.

FIG. 9 is a flowchart of an operating method of a memory device, according to some embodiments.

Referring to FIG. 9, a memory device (e.g., the pre-decoder circuit 310 in FIG. 5 included in the memory device) may predecode a faulty row address and output a signal representing a pre-decoded faulty row address in operation S110. As used herein, "outputting a signal" (or similar language) does not necessarily mean the signal is output from the memory device, but instead may refer to the signal being transmitted internally within the memory device by, for example, component(s) or circuit(s) of the memory device, unless the context clearly indicates otherwise.

In some embodiments, the memory device (e.g., the pre-decoder circuit 310 in FIG. 5 included in the memory device) may receive N signals each representing one of a plurality of bits representing the faulty row address and may output $2^N$ sub signals having one bit value corresponding to one bit state among $2^N$ bit states of the N signals. Here, N is an integer of at least 2 (i.e., N is an integer greater than or equal to 2).

The memory device (e.g., the pre-decoder circuit 310 in FIG. 5 included in the memory device) may predecode a row address and output a signal representing a pre-decoded row address in operation S120.

In some embodiments, the memory device (e.g., the pre-decoder circuit 310 in FIG. 5 included in the memory device) may receive N signals each representing one of a plurality of bits representing the row address and may output $2^N$ sub signals having one bit value corresponding to one bit state among $2^N$ bit states of the N signals. Here, N is an integer of at least 2 (i.e., N is an integer greater than or equal to 2).

The memory device (e.g., the comparison circuit 330 in FIG. 5 included in the memory device) may compare a bit value of the pre-decoded faulty row address with a bit value of the pre-decoded row address and output hit signals in operation S130. For example, the memory device (e.g., the comparison circuit 330 in FIG. 5 included in the memory device) may output the hit signals based on a result of the comparison.

In some embodiments, the memory device (e.g., the comparison circuit 330 in FIG. 5 included in the memory device) may compare a bit value of $2^N$ sub signals representing the pre-decoded row address with a bit value of $2^N$ sub signals representing the pre-decoded faulty row address and output a hit signal indicating match or mismatch between the bit value of N bits of the faulty row address and the bit value of N bits of the row address. Here, N is an integer of at least 2 (i.e., N is an integer greater than or equal to 2).

The memory device (e.g., the combinational logic circuit 340 in FIG. 5 included in the memory device) may output a repair enable signal based on the hit signals in operation S140.

The memory device may perform a row repair operation based on the repair enable signal in operation S150. Here, the row repair operation may refer to an operation of replacing the faulty row address with a redundancy row address.

Figure 10:
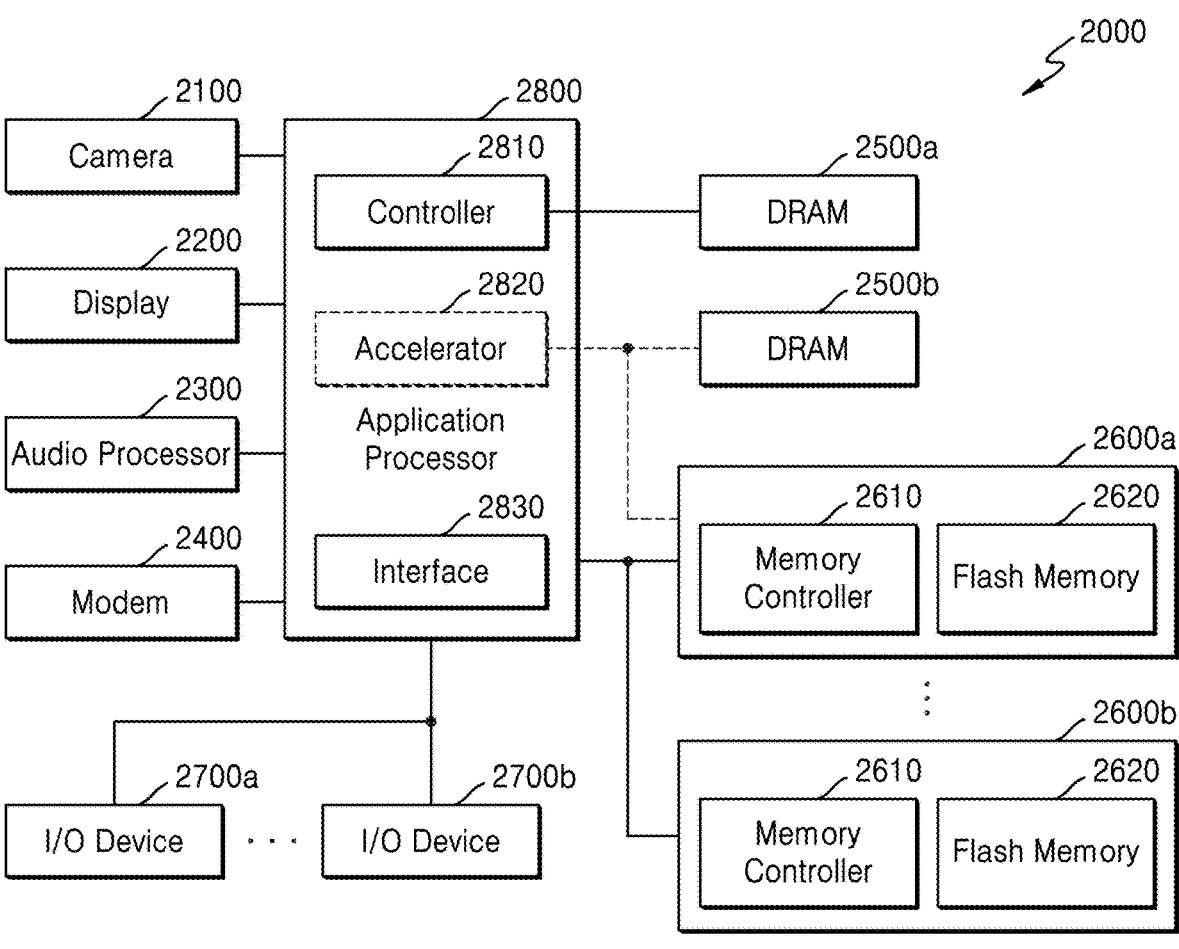
FIG. 10 is a block diagram of a system illustrating an electronic device including a memory device, according to some embodiments.

FIG. 10 is a block diagram of a system 2000 illustrating an electronic device including a memory device, according to some embodiments.

Referring to FIG. 10, the system 2000 may include a camera 2100, a display 2200, an audio processor 2300, a modem 2400, DRAMs 2500a and 2500b, flash memory devices 2600a and 2600b, I/O devices 2700a and 2700b, and an application processor (AP) 2800. The system 2000 may correspond to a laptop computer, a mobile phone, a smartphone, a tablet, a personal computer (PC), a wearable device, a healthcare device, or an Internet of things (IoT) device, but is not limited thereto. The system 2000 may correspond to a server or a PC.

The camera 2100 may shoot a still image or a video under a user's control and store image/video data or transmit the image/video data to the display 2200. The audio processor 2300 may process audio data included in the contents of the flash memory devices 2600a and 2600b or a network. For wired/wireless data communication, the modem 2400 may modulate a signal, transmit a modulated signal, and demodulate a received signal to restore an original signal. The I/O devices 2700a and 2700b may include devices, such as a universal serial bus (USB) storage, a digital camera, a secure digital (SD) card, a digital versatile disc (DVD), a network adapter, and a touch screen, which provide digital input and/or output functions.

The AP 2800 may generally control operations of the system 2000. The AP 2800 may include a controller 2810, an accelerator block or an accelerator chip 2820, and an interface 2830. The AP 2800 may control the display 2200 to display some of the contents stored in the flash memory devices 2600a and 2600b. When the AP 2800 receives user input through the I/O devices 2700a and 2700b, the AP 2800 may perform a control operation corresponding to the user input. The AP 2800 may also include an accelerator block, which is a dedicated circuit for artificial intelligence (AI) data operations, or the accelerator chip 2820 may be provided separately from the AP 2800. The DRAM 2500b may be additionally mounted on the accelerator block or the accelerator chip 2820. An accelerator is a functional block that specially performs a certain function of the AP 2800 and may include a graphics processing unit (GPU) that is a functional block specially performing graphics data processing, a neural processing unit (NPU) that is a functional block specially performing AI calculation and inference, and a data processing unit (DPU) that is a functional block specially performing data transmission.

The system 2000 may include the plurality of DRAMs 2500a and 2500b. The AP 2800 may control the DRAMs 2500a and 2500b through commands and mode register setting, which comply with Joint Electron Device Engineering Council (JEDEC) standards, or may set a DRAM interface protocol and communicate with the DRAMs 2500a and 2500b to use company's unique functions, such as low voltage, high speed, reliability, and a cyclic redundancy check (CRC) function, and/or an error correction code (ECC) function. For example, the AP 2800 may communicate with the DRAM 2500a through an interface, such as LPDDR4 or LPDDR5, complying with the JEDEC standards, and the accelerator block or the accelerator chip 2820 may set a new DRAM interface protocol and communicate with the DRAM 2500b to control the DRAM 2500b, which has a higher bandwidth than the DRAM 2500a for an accelerator.

Although only the DRAMs 2500a and 2500b are illustrated in FIG. 10, embodiments are not limited thereto, and any type of memory, such as PRAM, static RAM (SRAM), MRAM, RRAM, ferroelectric RAM (FRAM), or hybrid RAM, which satisfies the requirements of a bandwidth, a response speed, and/or a voltage for the AP 2800 or the accelerator chip 2820, may be used. The DRAMs 2500a and 2500b may have relatively less latency and bandwidth than the I/O devices 2700a and 2700b or the flash memory devices 2600a and 2600b. The DRAMs 2500a and 2500b may be initialized when the system 2000 is powered on and may be loaded with an operating system (OS) and application data to be used as a temporary storage of the OS and the application data or may be used as a space for execution of various kinds of software code.

The four fundamental arithmetic operations, i.e., addition, subtraction, multiplication, and division, vector operations, address operation, or fast Fourier transform (FFT) operations may be performed in the DRAMs 2500a and 2500b. Functions for executions used for inference may also be performed in the DRAMs 2500a and 2500b. At this time, the inference may be performed during a deep learning algorithm using an artificial neural network. The deep learning algorithm may include a training phase, in which a model is trained using various data, and an inference phase, in which data is recognized using the trained model. In some embodiments, an image shot by a user through the camera 2100 may undergo signal processing and may be stored in the DRAM 2500b, and the accelerator block or the accelerator chip 2820 may perform an AI data operation using data stored in the DRAM 2500b and a function used for inference to recognize the data.

The system 2000 may include a plurality of storages or flash memory devices 2600a and 2600b, which have a larger capacity than the DRAMs 2500a and 2500b. The accelerator block or the accelerator chip 2820 may perform a training phase and an AI data operation using the flash memory devices 2600a and 2600b. In some embodiments, each of the flash memory devices 2600a and 2600b may include a memory controller 2610 and a flash memory 2620 and may allow the AP 2800 and/or the accelerator chip 2820 to efficiently perform a training phase and an inference AI data operation using an arithmetic unit included in the memory controller 2610. The flash memory devices 2600a and 2600b may store images shot through the camera 2100 or data received from a data network. For example, the flash memory devices 2600a and 2600b may store augmented and/or virtual reality contents, high definition (HD) contents, or ultra-high definition (UHD) contents.

In the system 2000, the DRAMs 2500a and 2500b may perform the operating method of a memory device, which has been described with reference to FIGS. 1 to 9. The operating method of a memory device may include predecoding a faulty row address, generating a signal representing a pre-decoded faulty row address, predecoding a row address, generating a signal representing a pre-decoded row address, comparing a bit value of the pre-decoded faulty row address with a bit value of the pre-decoded row address, generating hit signals, generating a repair enable signal based on the hit signals, and performing a repair operation based on the repair enable signal.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof. It will be understood that, although the terms first, second, etc. may be used herein to describe various elements, these elements should not be limited by these terms. Rather, these terms are only used to distinguish one element from another. For example, a first element could be termed a second element, and, similarly, a second element could be termed a first element, without departing from the scope of the present disclosure.

While the inventive concepts have been particularly shown and described with reference to example embodiments thereof, it will be understood that various changes in form and details may be made therein without departing from the scope of the following claims.

What is claimed is:

1. An operating method of a memory device, the operating method comprising:

outputting, using a pre-decoder circuit, a signal representing a pre-decoded faulty row address based on predecoding a faulty row address;

outputting, using the pre-decoder circuit, a signal representing a pre-decoded row address based on predecoding a row address;

outputting hit signals based on comparing a bit value of the pre-decoded faulty row address with a bit value of the pre-decoded row address;

outputting a repair enable signal based on the hit signals; and performing a row repair operation based on the repair enable signal.

2. The operating method of claim 1, wherein the outputting of the signal representing the pre-decoded faulty row address comprises:

receiving N signals each representing one of a plurality of bits of the faulty row address, wherein N is an integer greater than or equal to 2; and outputting $2^N$ sub signals having a bit value corresponding to one of $2^N$ bit states of the N signals.

3. The operating method of claim 1, wherein the outputting of the signal representing the pre-decoded row address comprises:

receiving N signals each representing one of a plurality of bits of the row address, wherein N is an integer greater than or equal to 2; and outputting $2^N$ sub signals having a bit value corresponding to one of $2^N$ bit states of the N signals.

4. The operating method of claim 1, wherein the outputting of the hit signals comprises:

comparing a bit value of $2^N$ sub signals representing the pre-decoded row address with a bit value of $2^N$ sub signals representing the pre-decoded faulty row address; and outputting a hit signal indicating a match or a mismatch between a bit value of N bits of the faulty row address and a bit value of N bits of the row address, wherein N is an integer greater than or equal to 2.

5. A memory device comprising:

a memory cell array including a redundancy memory cell; and a repair circuit configured to perform a row repair operation by replacing a faulty row address with a redundancy row address, based on a repair enable signal, wherein the repair circuit comprises:

a first register configured to store the faulty row address;

a second register configured to store a row address; and a repair control circuit, and wherein the repair control circuit comprises:

a pre-decoder circuit configured to predecode the faulty row address and output a signal that represents a pre-decoded faulty row address, and predecode the row address and output a signal that represents a pre-decoded row address;

a comparison circuit configured to compare a bit value of the pre-decoded faulty row address with a bit value of the pre-decoded row address and output hit signals based on a result of the comparison; and a combinational logic circuit configured to output the repair enable signal based on the hit signals.

6. The memory device of claim 5, wherein the pre-decoder circuit includes a first row pre-decoder circuit configured to:

receive N signals that each represent one of a plurality of bits of the row address, wherein N is an integer greater than or equal to 2, and output $2^N$ sub signals having a bit value corresponding to one of 2 bit states of the N signals.

7. The memory device of claim 6, wherein a bit value of only one of the $2^N$ sub signals is 1.

8. The memory device of claim 5, wherein the pre-decoder circuit includes a first row pre-decoder circuit configured to:

receive a signal representing a first bit of the row address and a signal representing a second bit of the row address, and output four sub signals representing a bit state of the first bit and the second bit of the row address.

9. The memory device of claim 8, wherein a bit state represented by respective bit values of the four sub signals corresponds to a first pre-decoded row address included in the pre-decoded row address.

10. The memory device of claim 9, wherein the first row pre-decoder circuit comprises:

a second inverter circuit electrically connected between a first node and a second node, the first node configured to have the signal representing the first bit of the row address applied thereto;

a third inverter circuit electrically connected between a third node and a fourth node, the third node configured to have the signal representing the second bit of the row address applied thereto;

a first AND logic circuit electrically connected to the second node, the fourth node, and a first output node, the first output node configured to output a first sub signal representing a first bit of the first pre-decoded row address;

a second AND logic circuit electrically connected to the first node, the fourth node, and a second output node, the second output node configured to output a second sub signal representing a second bit of the first pre-decoded row address;

a third AND logic circuit electrically connected to the second node, the third node, and a third output node, the third output node configured to output a third sub signal representing a third bit of the first pre-decoded row address; and a fourth AND logic circuit electrically connected to the first node, the third node, and a fourth output node, the fourth output node configured to output a fourth sub signal representing a fourth bit of the first pre-decoded row address.

11. The memory device of claim 5, wherein the pre-decoder circuit includes a first fuse pre-decoder circuit configured to:

receive N signals that each represent one of a plurality of bits of the faulty row address, wherein N is an integer greater than or equal to 2, and output $2^N$ sub signals having a bit value corresponding to one of $2^N$ bit states of the N signals.

12. The memory device of claim 11, wherein a bit value of only one of the $2^N$ sub signals is 1.

13. The memory device of claim 5, wherein the pre-decoder circuit includes a first fuse pre-decoder circuit configured to:

receive a signal representing a first bit of the faulty row address and a signal representing a second bit of the faulty row address, and output four sub signals representing a bit state of the first bit and the second bit of the faulty row address.

14. The memory device of claim 13, wherein a bit state represented by respective bit values of the four sub signals corresponds to a first pre-decoded faulty row address included in the pre-decoded faulty row address.

15. The memory device of claim 5, wherein the comparison circuit includes a first sub comparison circuit configured to:

receive four sub signals respectively representing bits of a first pre-decoded row address included in the pre-decoded row address and four sub signals respectively representing bits of a first pre-decoded faulty row address included in the pre-decoded faulty row address, and output a first hit signal of the hit signals.

16. The memory device of claim 15, wherein the first sub comparison circuit includes a sixth inverter circuit, a seventh inverter circuit, an eighth inverter circuit, a ninth inverter circuit, a first P-type transistor, a second P-type transistor, a third P-type transistor, a fourth P-type transistor, a first N-type transistor, a second N-type transistor, a third N-type transistor, and a fourth N-type transistor, wherein the four sub signals respectively representing the bits of the first pre-decoded row address include a first sub signal representing a first bit of the first pre-decoded row address, a second sub signal representing a second bit of the first pre-decoded row address, a third sub signal representing a third bit of the first pre-decoded row address, and a fourth sub signal representing a fourth bit of the first pre-decoded row address, and wherein the four sub signals respectively representing the bits of the first pre-decoded faulty row address include a fifth sub signal representing a first bit of the first pre-decoded faulty row address, a sixth sub signal representing a second bit of the first pre-decoded faulty row address, a seventh sub signal representing a third bit of the first pre-decoded faulty row address, and an eighth sub signal representing a fourth bit of the first pre-decoded faulty row address.

17. The memory device of claim 16, wherein the sixth inverter circuit is electrically connected between a ninth node and a gate terminal of the first P-type transistor, the ninth node configured to have the fifth sub signal applied thereto, wherein the gate terminal of the first P-type transistor is electrically connected to an output terminal of the sixth inverter circuit, wherein a first terminal of the first P-type transistor is electrically connected to a tenth node, the tenth node configured to have the first sub signal applied thereto, wherein a second terminal of the first P-type transistor is electrically connected to an eleventh node, the eleventh node configured to output the first hit signal, wherein a gate terminal of the first N-type transistor is electrically connected to the ninth node, wherein a first terminal of the first N-type transistor is electrically connected to the tenth node, and wherein a second terminal of the first N-type transistor is electrically connected to the eleventh node.

18. The memory device of claim 5, wherein the combinational logic circuit comprises:

a first NAND logic circuit configured to receive a first hit signal, a second hit signal, and a third hit signal of the hit signals;

a second NAND logic circuit configured to receive a fourth hit signal, a fifth hit signal, and a sixth hit signal of the hit signals;

a third NAND logic circuit configured to receive a seventh hit signal of the hit signals;

a NOR logic circuit configured to receive an output of the first NAND logic circuit, an output of the second NAND logic circuit, and an output of the third NAND logic circuit, the NOR logic circuit further configured to output a pre-repair enable signal; and a first inverter circuit configured to receive the pre-repair enable signal and output the repair enable signal.

19. A memory system comprising:

a host device configured to transmit a command for a repair operation; and a memory device configured to perform the repair operation in response to the command, wherein the memory device includes a repair control circuit configured to:

predecode, using a pre-decoder circuit of the repair control circuit, a faulty row address and output a signal that represents a pre-decoded faulty row address, predecode, using the pre-decoder circuit, a row address and output a signal that represents a pre-decoded row address, compare a bit value of the pre-decoded faulty row address with a bit value of the pre-decoded row address and output hit signals based on a result of the comparison, and output a repair enable signal based on the hit signals.

20. The memory system of claim 19, wherein the repair control circuit includes a first row pre-decoder circuit configured to:

receive N signals each representing one of a plurality of bits of the row address, wherein N is an integer greater than or equal to 2, and output $2^N$ sub signals having a bit value corresponding to one of $2^N$ bit states of the N signals.

\* \* \* \* \*